(12) United States Patent
Omata

(10) Patent No.: US 7,960,261 B2
(45) Date of Patent: Jun. 14, 2011

(54) METHOD FOR MANUFACTURING CRYSTALLINE SEMICONDUCTOR FILM AND METHOD FOR MANUFACTURING THIN FILM TRANSISTOR

(75) Inventor: Takatsugu Omata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 11 days.

(21) Appl. No.: 12/044,193

(22) Filed: Mar. 7, 2008

(65) Prior Publication Data
US 2008/0233719 A1   Sep. 25, 2008

(30) Foreign Application Priority Data
Mar. 23, 2007   (JP) .................. 2007-076908

(51) Int. Cl.
*H01L 29/786* (2006.01)
(52) U.S. Cl. ........... 438/487; 257/52; 257/E21.533
(58) Field of Classification Search .......... 438/487, 438/482, 488; 257/52, 59, E21.52, E21.533
See application file for complete search history.

(56) References Cited

U.S. PATENT DOCUMENTS

| | | |
|---|---|---|
| 4,594,471 A | 6/1986 | Yamazaki |
| 4,603,470 A | 8/1986 | Yamazaki |
| 4,725,558 A | 2/1988 | Yamazaki et al. |
| 4,861,964 A | 8/1989 | Sinohara |
| 4,927,493 A | 5/1990 | Yamazaki et al. |
| 4,937,129 A | 6/1990 | Yamazaki |
| 4,954,217 A | 9/1990 | Yamazaki et al. |
| 4,970,368 A | 11/1990 | Yamazaki et al. |
| 4,975,145 A | 12/1990 | Yamazaki et al. |
| 5,017,806 A * | 5/1991 | Edelstein et al. ............ 359/330 |
| 5,089,426 A | 2/1992 | Yamazaki et al. |
| 5,187,601 A | 2/1993 | Yamazaki et al. |
| 5,585,949 A | 12/1996 | Yamazaki et al. |
| 5,708,252 A | 1/1998 | Shinohara et al. |
| 5,866,444 A | 2/1999 | Yamazaki et al. |
| 6,149,988 A | 11/2000 | Shinohara et al. |
| 6,261,856 B1 | 7/2001 | Shinohara et al. |

(Continued)

FOREIGN PATENT DOCUMENTS
JP   2000-133636   5/2000
(Continued)

OTHER PUBLICATIONS

Wang et al., "Near-infrared femtosecond laser crystallized poly-Si thin film transistors." Optics Express vol. 15, No. 11 (May 28, 2007): pp. 6982-6987.*

(Continued)

*Primary Examiner* — Matthew S Smith
*Assistant Examiner* — Michele Fan
(74) *Attorney, Agent, or Firm* — Husch Blackwell LLP

(57) ABSTRACT

The present invention relates to a method for manufacturing a polycrystalline semiconductor film that can be used for a semiconductor device. In the method, an amorphous semiconductor film is irradiated with a femtosecond laser to be crystallized. By laser irradiation using a femtosecond laser, when an amorphous semiconductor film over which a cap film is formed is crystallized with a laser, it becomes possible to perform crystallization of the semiconductor film and removal of the cap film at the same time. Therefore, a step of removing the cap film in a later step can be omitted.

22 Claims, 19 Drawing Sheets

U.S. PATENT DOCUMENTS

| | | | |
|---|---|---|---|
| 6,391,747 | B1 | 5/2002 | Okumura et al. |
| 6,445,005 | B1 | 9/2002 | Yamazaki et al. |
| 6,641,933 | B1 | 11/2003 | Yamazaki et al. |
| 6,670,637 | B2 | 12/2003 | Yamazaki et al. |
| 6,894,312 | B2 | 5/2005 | Yamazaki et al. |
| 6,964,831 | B2 * | 11/2005 | Lin ................................. 430/22 |
| 7,112,115 | B1 | 9/2006 | Yamazaki et al. |
| 7,112,374 | B2 | 9/2006 | Yamazaki et al. |
| 7,176,069 | B2 | 2/2007 | Yamazaki et al. |
| 7,180,197 | B2 | 2/2007 | Nishi et al. |
| 7,199,516 | B2 | 4/2007 | Seo et al. |
| 7,202,155 | B2 | 4/2007 | Fukuchi |
| 7,226,819 | B2 | 6/2007 | Maekawa et al. |
| 2002/0164842 | A1 * | 11/2002 | Nakajima ..................... 438/149 |
| 2005/0043186 | A1 | 2/2005 | Maekawa et al. |
| 2006/0099810 | A1 * | 5/2006 | Voronov et al. ............... 438/689 |
| 2006/0158482 | A1 | 7/2006 | Nakamura et al. |
| 2006/0194419 | A1 * | 8/2006 | Araki ........................... 438/489 |
| 2006/0270175 | A1 | 11/2006 | Aoki et al. |
| 2007/0051952 | A1 | 3/2007 | Yamazaki et al. |
| 2007/0178672 | A1 | 8/2007 | Tanaka et al. |
| 2008/0116183 | A1 * | 5/2008 | Curry ....................... 219/121.75 |

FOREIGN PATENT DOCUMENTS

| | | | |
|---|---|---|---|
| JP | 2000-228360 | | 8/2000 |
| JP | 2002-164591 | | 6/2002 |
| JP | 2003240995 A | * | 8/2003 |

OTHER PUBLICATIONS

McDonald et al., "Femtosecond Laser Ablation of Silicon (100) with Thermal Oxide Thin Films of Varying Thickness." Quantum Electronics and Laser Science (2005): pp. 910-912.*

Yamazaki.S et al., "Fabrication of the Large-Area Integrated A-Si Solar Cells,", Mat. Res. Soc. Symp. Proc. (Materials Research Society Symposia Proceedings), vol. 70, 1986, pp. 487-492.

Yamazaki.S et al., "Mask-Less Fabrication of A-Si Solar Cell Using Laser Scribe Process,", Conference Record of the 17th IEEE PVSC (Photovoltaic Specialists Conference), May 1, 1984, pp. 206-211.

* cited by examiner

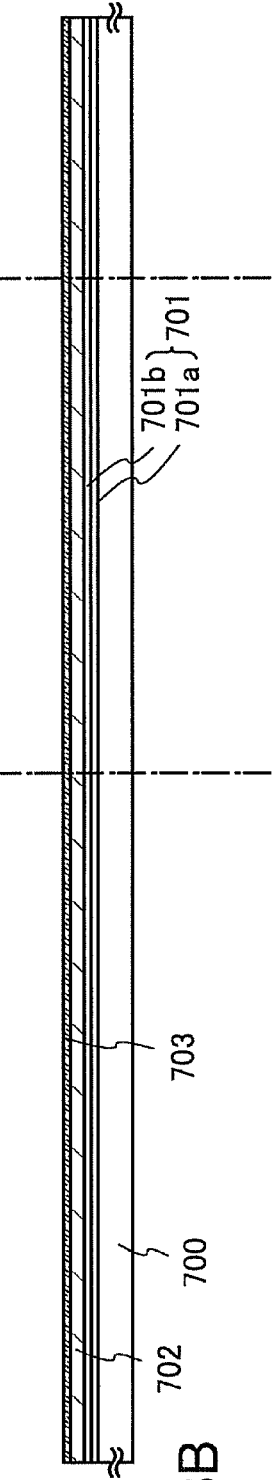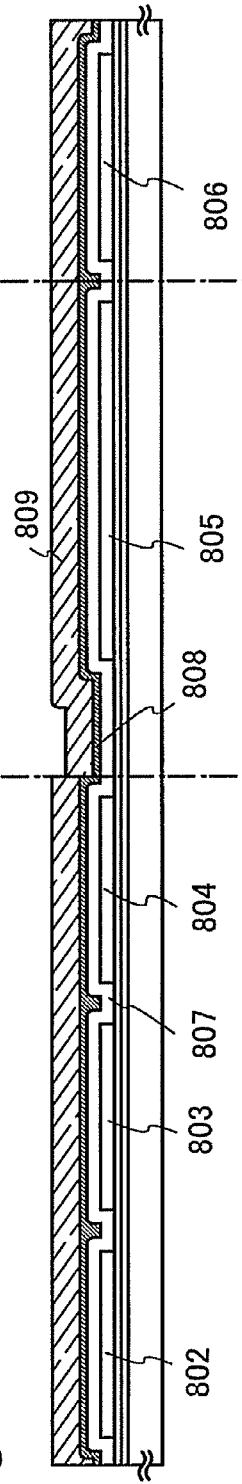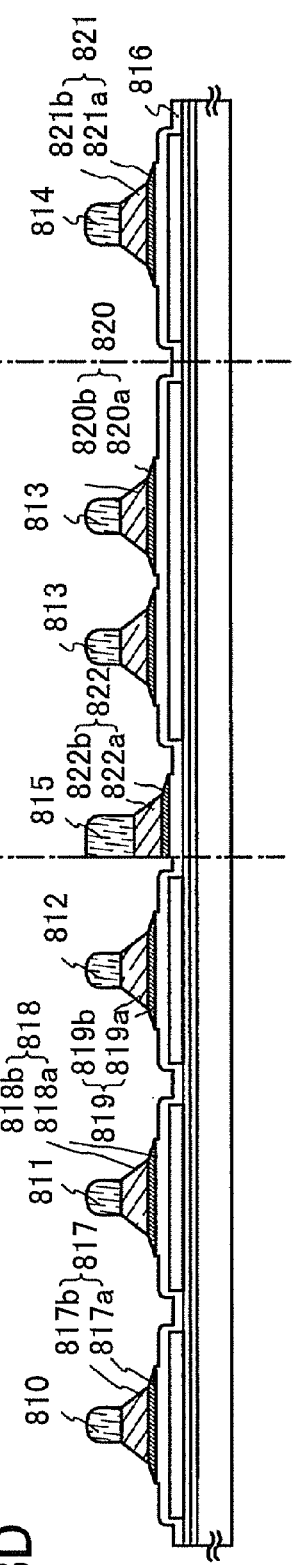

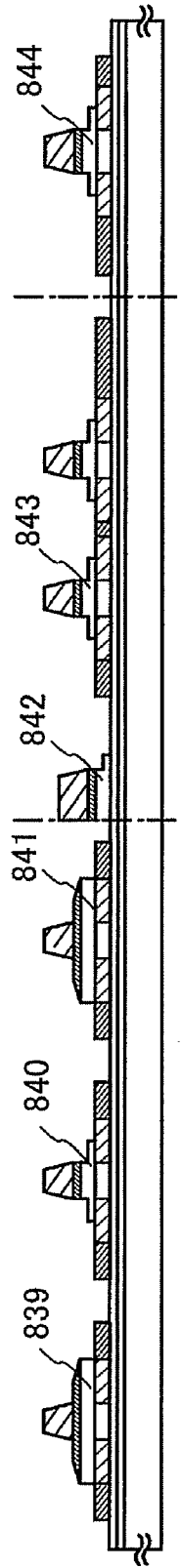
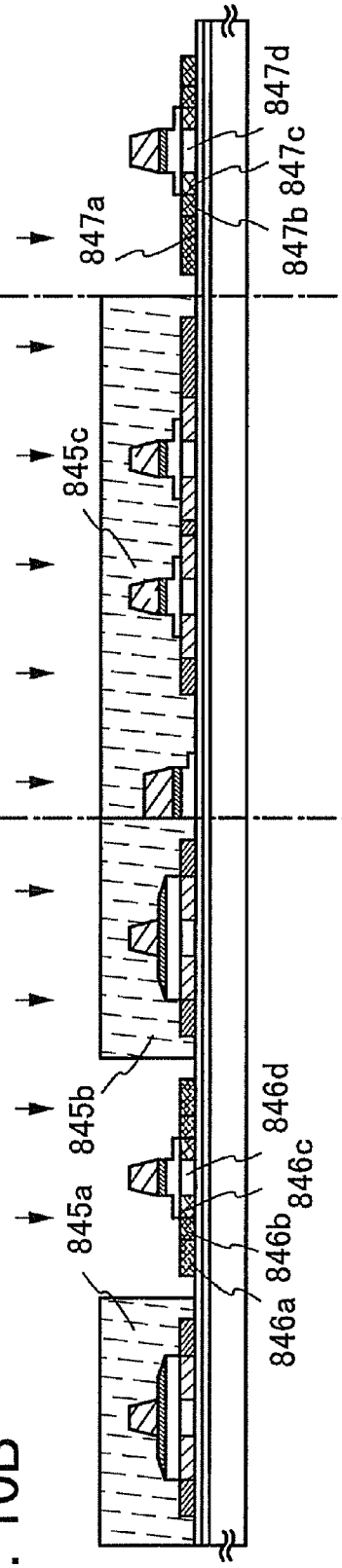
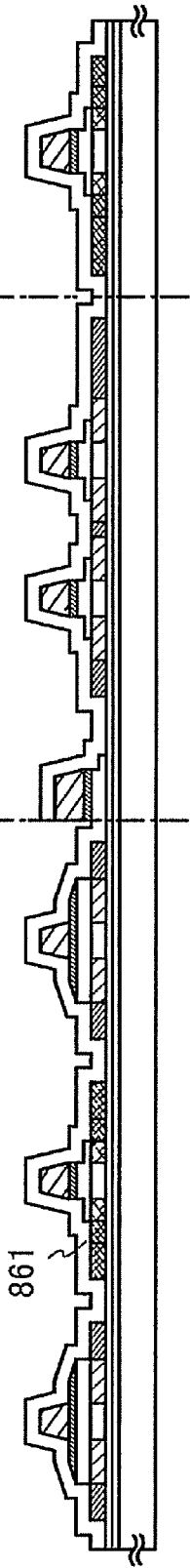
FIG. 10A
FIG. 10B
FIG. 10C

833b、849

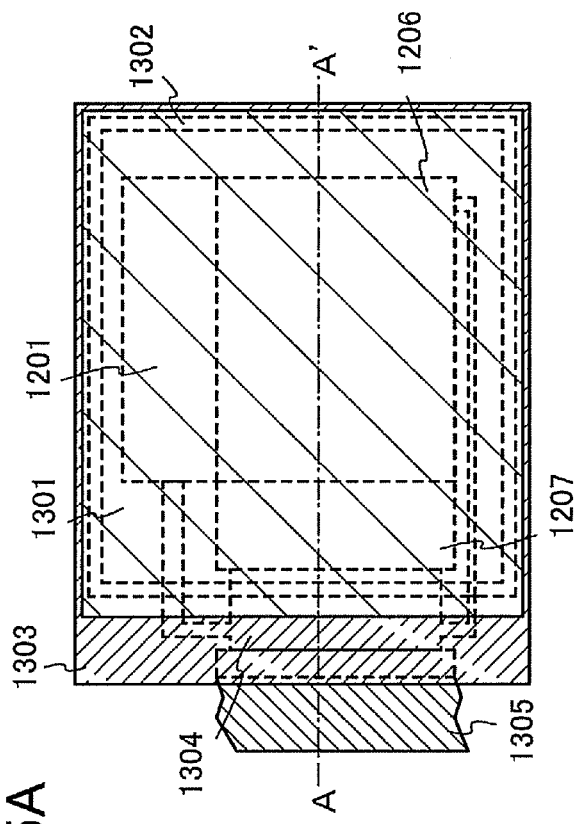
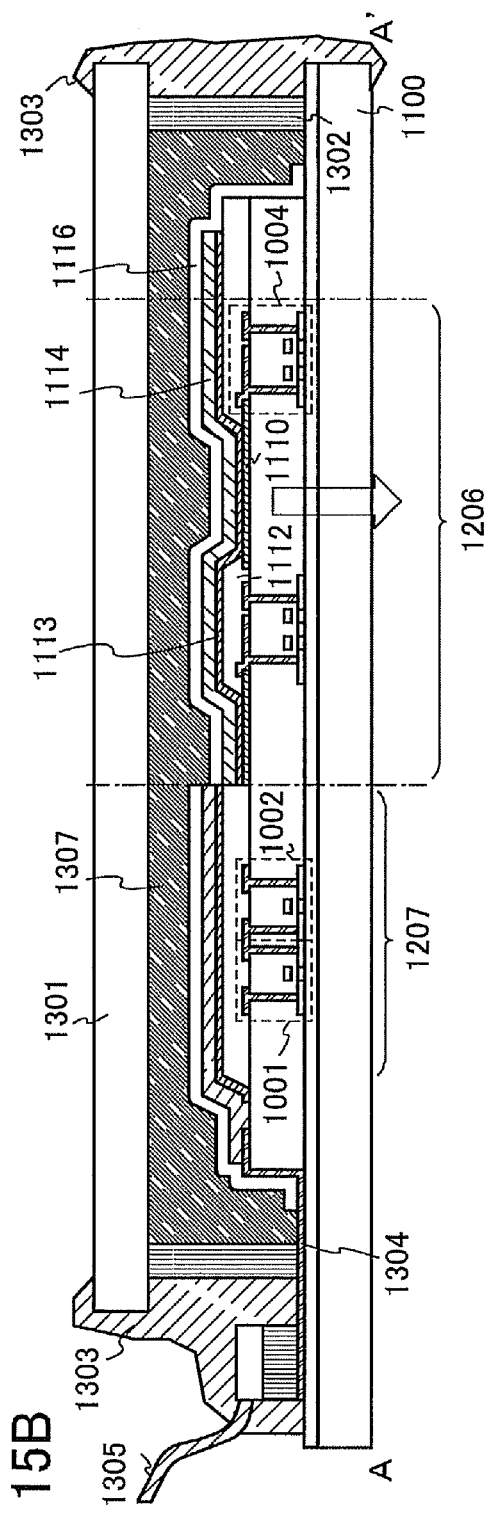
FIG. 15A
FIG. 15B

METHOD FOR MANUFACTURING CRYSTALLINE SEMICONDUCTOR FILM AND METHOD FOR MANUFACTURING THIN FILM TRANSISTOR

BACKGROUND OF THE INVENTION

1. Field of the Invention

The present invention relates to a method for manufacturing a crystalline semiconductor film that can be used in a semiconductor device, by which an amorphous semiconductor film is irradiated with a laser to be crystallized, and a method for manufacturing a thin film transistor using the crystalline semiconductor film. Note that a semiconductor device in the present specification generally indicates a device capable of functioning by utilizing semiconductor characteristics, and electro-optic devices, semiconductor circuits, and electronic devices are all semiconductor devices.

2. Description of the Related Art

In recent years, it has been possible to form a liquid crystal display device provided with a driver circuit over a cheap glass substrate by crystalline silicon thin film transistors (TFT). As a method for forming a crystalline silicon thin film, a method can be given, in which an amorphous silicon film is irradiated with laser light to be crystallized, thereby obtaining a crystalline silicon thin film.

It is generally known that use of a continuous laser in crystallization of a semiconductor film make a grain size of crystal formed in the semiconductor film to be increased. When a crystal grain size in the semiconductor film becomes large, the number of grain boundaries in a channel region of a TFT that is formed using the semiconductor film is reduced, and mobility is increased, so that the semiconductor film can be utilized for development of high performance devices.

By changing the scanning speed and the spot form of the substrate as appropriate, even when a pulsed wave laser is used, a semiconductor film having large crystal grains can be obtained as similar to the case of using the continuous wave laser.

In a crystallization method of a semiconductor film using a laser, it is known that orientation of crystal is easily aligned, for example, by forming a silicon oxide film with a thickness of about several hundreds nm as a cap film on the semiconductor film that is to be crystallized and performing laser crystallization. Further, it is also known that the cap film makes laser crystallization possible even when the semiconductor film is an ultra-thin film with a thickness of 30 nm or less.

However, in a case where laser crystallization is performed after forming a cap film on the semiconductor film, the cap film is necessary to be removed in a step after the laser crystallization, and the number of steps is increased. In the case of manufacturing TFTs and the like, a step immediately after the laser crystallization step is usually formation of islands by patterning the semiconductor film, and the cap film is necessary to be removed before formation of islands because the cap film becomes hindrance to photo resists and the like. The removal of the cap film is performed in an etching step. A chemical solution such as HF is used in a wet etching method and an etching gas such as $CF_4$ is used in a dry etching, and therefore, the cost is increased caused by increase of steps, and treatment of the chemical solution and gas is needed (for example, Reference 1: Japanese Published Patent Application No. 2000-228360).

SUMMARY OF THE INVENTION

It is an object of the present invention to simplify a step of crystallization of a semiconductor film by forming a cap film over the semiconductor film and a step of removal of the cap film, and to shorten time that is needed for the steps of crystallization and removal of the cap film.

In order to solve the above object, a method for manufacturing a crystalline semiconductor film of the present invention includes a step of forming an amorphous semiconductor film over a substrate, a step of forming a cap film over the amorphous semiconductor film, and a step of crystallizing the amorphous semiconductor film concurrently with removing the cap film by irradiation with a femtosecond laser from above the cap film.

Another method for manufacturing a crystalline semiconductor film of the present invention includes a step of forming an amorphous semiconductor film over a substrate, a step of forming a cap film over the amorphous semiconductor film, a step of crystallizing the amorphous semiconductor film by irradiation with a first laser from above the cap film, and a step of removing the cap film by irradiation with a second laser that is a femtosecond laser from above the cap film. It is a feature of the invention that irradiation with the second laser is performed during the irradiation with the first laser.

A method for manufacturing a thin film transistor of the present invention includes a step of forming an amorphous semiconductor film over a substrate, a step of forming a cap film over the amorphous semiconductor film, a step of crystallizing the amorphous semiconductor film to form a crystalline semiconductor film concurrently with removing the cap film by irradiation with a femtosecond laser from above the cap film, and a step of forming a channel region, a source region, and drain region using the crystalline semiconductor film.

Another method for manufacturing a thin film transistor of the present invention includes a step of forming an amorphous semiconductor film over a substrate, a step of forming a cap film over the amorphous semiconductor film, a step of crystallizing the amorphous semiconductor film by irradiation with a first laser from above the cap film to form a crystalline semiconductor film, a step of removing the cap film by irradiation with a second laser that is a femtosecond laser from above the cap film, and a step of forming a channel region, a source region, and drain region using the crystalline semiconductor film. It is a feature of the invention that the irradiation with the second laser is performed during the irradiation with the first laser.

In methods for manufacturing a crystalline semiconductor film and a thin film transistor of the present invention, it is preferable that a base film be formed over the substrate before the amorphous semiconductor film is formed over the substrate.

In methods for manufacturing a crystalline semiconductor film and a thin film transistor of the present invention, it is preferable that the cap film be a $SiN_xO_y$ film ($0 \leq x \leq 4/3$, $0 \leq y \leq 2$, $0 \leq 3x+2y \leq 4$). A thickness of the cap film is preferably greater than or equal to 200 nm and less than or equal to 1000 nm.

In methods for manufacturing a crystalline semiconductor film and a thin film transistor of the present invention, it is preferable that the crystalline semiconductor film be a polycrystalline semiconductor film.

In the present invention, the crystalline semiconductor film indicates a semiconductor film including a crystallized region, such as a polycrystalline semiconductor film, a microcrystalline semiconductor film, or a semi-amorphous semiconductor film.

In accordance with a method for manufacturing a crystalline semiconductor film of the present invention, by laser crystallization with a femtosecond laser, crystallization of the semiconductor film and removal of the cap film can be carried out at the same time when laser crystallization is performed to the amorphous semiconductor film over which the cap film is formed. Therefore, a step of removing the cap film in a later step can be omitted, which contributes to reduction in cost.

By adjusting energy of a femtosecond laser, crystallization of the semiconductor film and removal of the cap film can be separately carried out in different steps. In such a case, after crystallization of the semiconductor film, only the cap film over the semiconductor film can be removed using the femtosecond laser. Accordingly, an etching step of the cap film in a later step is unnecessary, and the number of steps of treatment of chemical solutions and gases can be reduced. Note that a laser other than a femtosecond laser, for examples, high harmonics such as an excimer laser or a solid laser may be used for crystallization of the semiconductor film in this case. Furthermore, since crystallization of the semiconductor film and removal of the cap film can be concurrently carried out, time taken for the steps of crystallization and removal of the cap film can be shortened.

BRIEF DESCRIPTION OF THE DRAWINGS

FIGS. 8A to 8D are cross-sectional views illustrating a manufacturing step of an active matrix substrate in Embodiment 2 of the present invention.

FIGS. 10A to 10C are cross-sectional views illustrating a manufacturing step of an active matrix substrate in Embodiment 2 of the present invention.

FIG. 15A is a top view illustrating a driver circuit and a pixel portion of a light-emitting device in Embodiment 4 of the present invention, and FIG. 15B is a cross-sectional view thereof.

DETAILED DESCRIPTION OF THE INVENTION

Figure 1A:
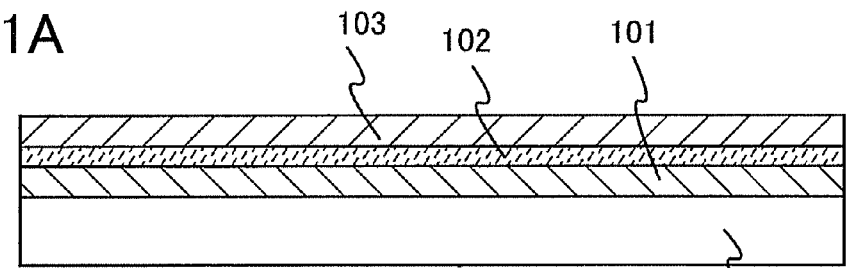
FIGS. 1A to 1E are diagrams illustrating a step of a manufacturing method of a semiconductor device in Embodiment Mode 1 of the present invention.

Embodiment modes of the present invention will be described with reference to the accompanying drawings. Note that the present invention is not defined to description below, and it is easily understood by those skilled in the art that modes and details can be modified in various ways without departing from the purpose and the scope of the present invention. Accordingly, the present invention should not be interpreted as being limited to the description of the embodiment modes below. Note that like portions in the drawings may be denoted by the like reference numerals in all drawings for describing the present invention.

Embodiment Mode 1

Hereinafter, a method for manufacturing a crystalline semiconductor film of the present invention and a method for manufacturing a thin film transistor using the crystalline semiconductor film will be described with reference to drawings. FIGS. 1A to 1E are diagrams illustrating a step of a manufacturing method of the present invention.

First, as shown in FIG. 1A, an insulating film 101 functioning as a base film is formed on one of surfaces of a substrate 100 having an insulating surface. The insulating film 101 functioning as a base film is formed using a silicon oxide film, a silicon nitride film, a silicon nitride oxide film containing a larger amount of nitrogen than that of oxygen, a silicon oxynitride film containing a larger amount of oxygen than that of nitrogen, each of which has a thickness of 50 to 150 nm, or the like as appropriate. Here, as the substrate 100 having an insulating surface, a glass substrate with a thickness of 0.7 mm is for example used. Further, as the insulating film 101 functioning as a base film, after a silicon nitride oxide film with a thickness of 50 nm is formed by a plasma CVD method, a silicon oxynitride film with a thickness of 100 nm is formed by a plasma CVD method.

Note that the insulating film 101 functioning as a base film may be provided as needed. In the case that the substrate 100 is the glass substrate, the insulating film 101 prevents impurities from glass from diffusing into a semiconductor film 102. In the case where the substrate 100 is a quartz substrate, the insulating film 101 functioning as a base film is not necessary to be provided. Further, a peeling film may be provided between the insulating film 101 and the substrate 100, and a semiconductor element may be peeled from the substrate 100 after completion of steps.

Next, an amorphous semiconductor film with a thickness of greater than or equal to 10 nm and less than or equal to 100 nm, preferably greater than or equal to 20 nm and less than or equal to 80 nm, is formed by a plasma CVD method as the semiconductor film 102 over the insulating film 101.

As for the semiconductor film 102, although amorphous silicon is used in this embodiment mode, silicon germanium ($Si_{1-x}Ge_x$ (0<x<0.1)), silicon carbide (SiC) in which single crystal has a diamond structure, and the like can be used.

When the semiconductor film 102 is an amorphous semiconductor film, the semiconductor film 102 may be heated after formation thereof. The heat treatment is for extracting hydrogen from the amorphous silicon film. Note that hydrogen is extracted so as to prevent a hydrogen gas from jetting from the semiconductor film 102 when irradiation with a laser beam, and the heat treatment can be omitted if the amount of hydrogen contained in the semiconductor film 102 is small. Here, the semiconductor film 102 is heated in an electric furnace at 500° C. for 1 hour.

Next, a $SiN_xO_y$ film ($0 \leq x \leq 1.5$, $0 \leq y \leq 2$, $0 \leq 4x+3y \leq 6$) with a thickness of greater than or equal to 200 nm and less than or equal to 1000 nm is formed as a cap film 103 over the semiconductor film 102.

The cap film 103 can be formed by a plasma CVD method, using monosilane ($SiH_4$), ammonium ($NH_3$), and nitrous oxide ($N_2O$) as a reaction gas. Note that nitrous oxide ($N_2O$) is used as oxidizer, and instead of nitrous oxide, oxygen which has an oxidizing effect may be used. By using such a gas, a silicon oxynitride film (hereinafter, refer to as $SiO_xN_y$ ($x \geq y$)) containing a larger amount of oxygen than that of nitrogen can be formed. The cap film 103 can be formed by a plasma CVD method using monosilane ($SiH_4$) and ammonium ($NH_3$) as a reaction gas. By using such a gas, a silicon nitride oxide film (hereinafter, refer to $SiN_xO_y$ (x>y)) containing a larger amount of nitrogen that that of oxide can be formed.

The cap film 103 preferably has a thermal value such as a thermal expansion coefficient and a value such as ductility that are close to those of an adjacent semiconductor film. Furthermore, the cap film 103 is preferably solid and dense film with small etching rate similar to a gate insulating film of a thin film transistor formed afterwards. Typically, the cap film 103 is preferably a dense film with an etching rate of greater than or equal to 1 nm/min and less than or equal to 150 nm/min, preferably greater than or equal to 10 nm/min and less than or equal to 130 nm/min, further preferably, greater than or equal to 10 nm/min and less than or equal to 100 nm/min, when etching is performed at 20° C., using a mixed solution containing ammonium hydrogen fluoride and ammonium fluoride or a hydrofluoric aqueous solution.

Further, the cap film 103 is preferably a dense film with an etching rate of greater than or equal to 100 nm/min and less than or equal to 150 nm/min, preferably, greater than or equal to 110 nm/min and less than or equal to 130 nm/min, by dry etching using a hydrofluorocarbon gas. Such a solid dense film can be formed by, for example, reducing the film formation rate. The cap film 103 is formed to be a dense film, whereby heat conductivity can be enhanced.

When a large amount of hydrogen is contained in the cap film 103, heat treatment for extracting hydrogen is performed similarly to the case of the semiconductor film 102.

Figure 1B:
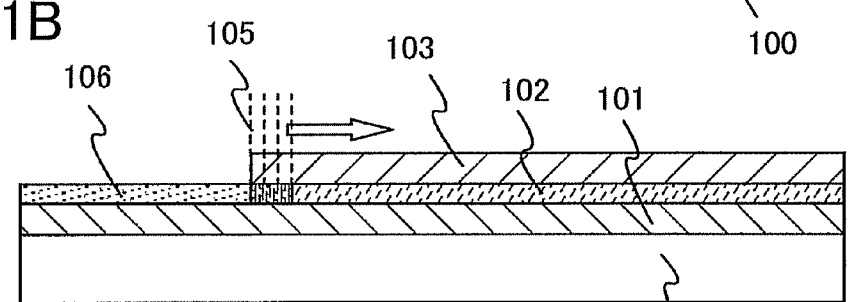
Figure 1C:
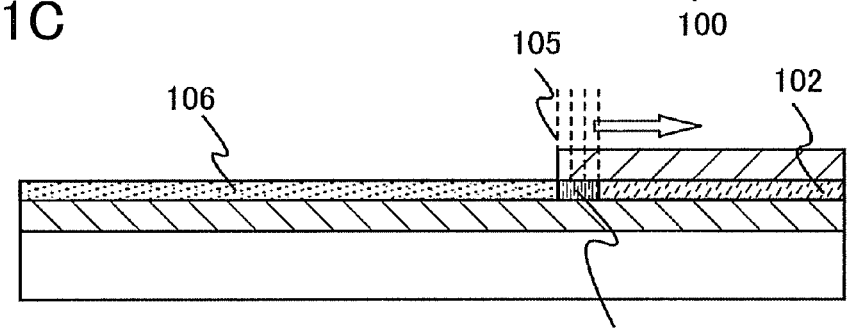

Next, as shown in FIGS. 1B and 1C, the substrate 100 is scanned (laser is fixed, and the substrate is moved) by irradiation with a laser beam 105 of a femtosecond laser from above the cap film 103, so that the semiconductor film 102 is crystallized, concurrently with removal of the cap film 103.

Irradiation is performed with a femtosecond laser having a pulse width of several f (femto) seconds to several hundred f seconds and an energy density of several hundred mJ/cm² to several ten J/cm², preferably, about 500 mJ/cm² to 5 J/cm². The scanning speed of the substrate is several ten mm/sec to several hundred mm/sec.

The femtosecond laser is a laser having an extremely short pulse width of a femtosecond (minus quadrillion ($10^{-15}$) seconds) band and generally indicates a laser having a pulse width of 1 f (femto) second or more and less than 1 p (pico) second. The femtosecond laser has instantaneous electric field intensity of 10 TW/cm². This laser is a pulsed laser, and laser light is localized in a spatial and time domain.

In the case of irradiation with general laser light in which energy of one photon is larger than a bandgap of a substance, one photon is absorbed and one electron is transferred into an excited state, so that light and the substance interact with each other. In contrast, in the case of using a femtosecond laser, the multiphoton absorption reaction in which a plurality of photons are absorbed at the same time is excited only in the vicinity of a focus. Therefore, unthinkable reaction in the general state can be induced.

As a principle of crystallization, a laser does not work on the semiconductor film 102 directly, but the laser light is first absorbed in the cap film 103 by multiphoton absorption, and the cap film 103 is heated. As heating proceeds, the heat is transmitted to the semiconductor film 102, and the semiconductor film 102 is crystallized. At the same time, heating of the cap film 103 proceeds, and ablation is conducted, so that the cap film 103 is removed.

Figure 1D:
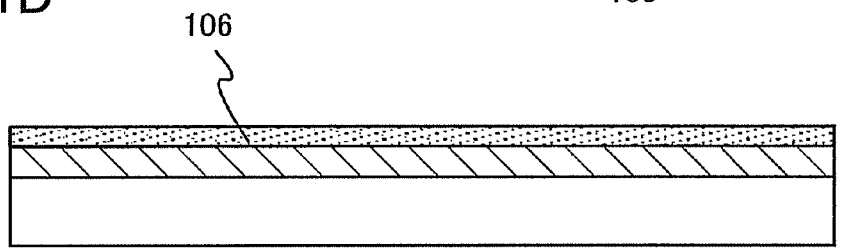

When irradiation with a laser beam 105 is finished, portions to be crystallized in the semiconductor film 102 are crystallized, thereby forming a crystalline semiconductor film 106 as shown in FIG. 1D. The cap film 103 over the crystalline semiconductor film 106 is removed.

Here, the crystalline semiconductor film 106 is a semiconductor film including a crystallized region, such as a polycrystalline semiconductor film, a microcrystalline semiconductor film, or a semiamorphous semiconductor film. In this embodiment mode, the crystalline semiconductor film preferably has a structure of a polycrystalline semiconductor film.

When only part of the semiconductor film 102 is crystallized, the cap film 103 located on the portion where the semiconductor film 102 is not crystallized can be removed by a femtosecond laser according to need. In such a case, by adjusting energy of the femtosecond laser, only the cap film 103 can be removed.

Figure 1E:
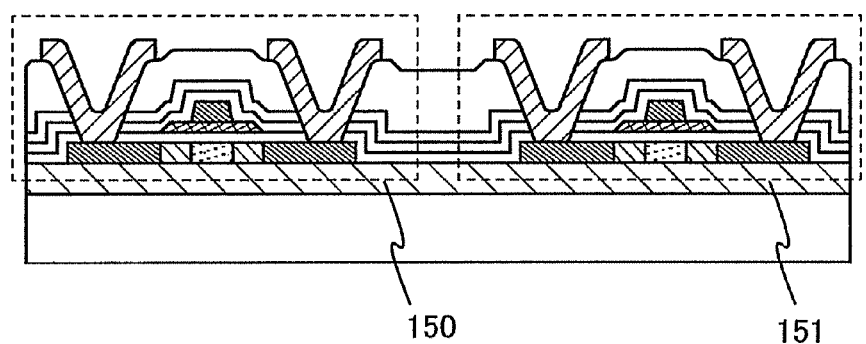

Next, as shown in FIG. 1E, channel regions and a source region and drain region are formed using the crystalline semiconductor film 106, so that a thin film transistor (TFT) 150 and a thin film transistor (TFT) 151 can be formed.

Before a manufacturing process of the thin film transistors is started, the thickness of the semiconductor film 102 may be reduced. Specifically, etching may be performed so as to reduce a thickness of the semiconductor film 102 to be greater than or equal to 10 nm and less than or equal to 30 nm. In the present invention, such a thin semiconductor film 102 can be crystallized by a laser because laser irradiation is performed from above the cap film 103. When the thin film transistor is formed using such a thin crystalline semiconductor film 106, a fully depleted thin film transistor is obtained, so that a thin film transistor with high mobility can be manufactured.

By using a femtosecond laser in laser crystallization of the substrate over which the cap film 103 is formed as described above, crystallization of the semiconductor film 102 and removal of the cap film 103 can be conducted at the same time. Therefore, a later step of removing the cap film can be omitted, which contributes to reduction in cost.

Further, by adjusting energy of the femtosecond laser, the crystallization of the semiconductor film 102 and removal of the cap film 103 can be separately conducted in different steps. In that case, after the semiconductor film 102 is crystallized, only the cap film 103 over the semiconductor film can be removed using the femtosecond laser. Accordingly, when the femtosecond laser is used for removal of the cap film, a chemical solution and a gas used in the etching step are unnecessary, and the number of steps of treatment of the chemical solution and the gas can be reduced.

Next, an optical system for forming the laser beam 105 of the femtosecond laser is described with reference to FIG. 2.

Figure 2:
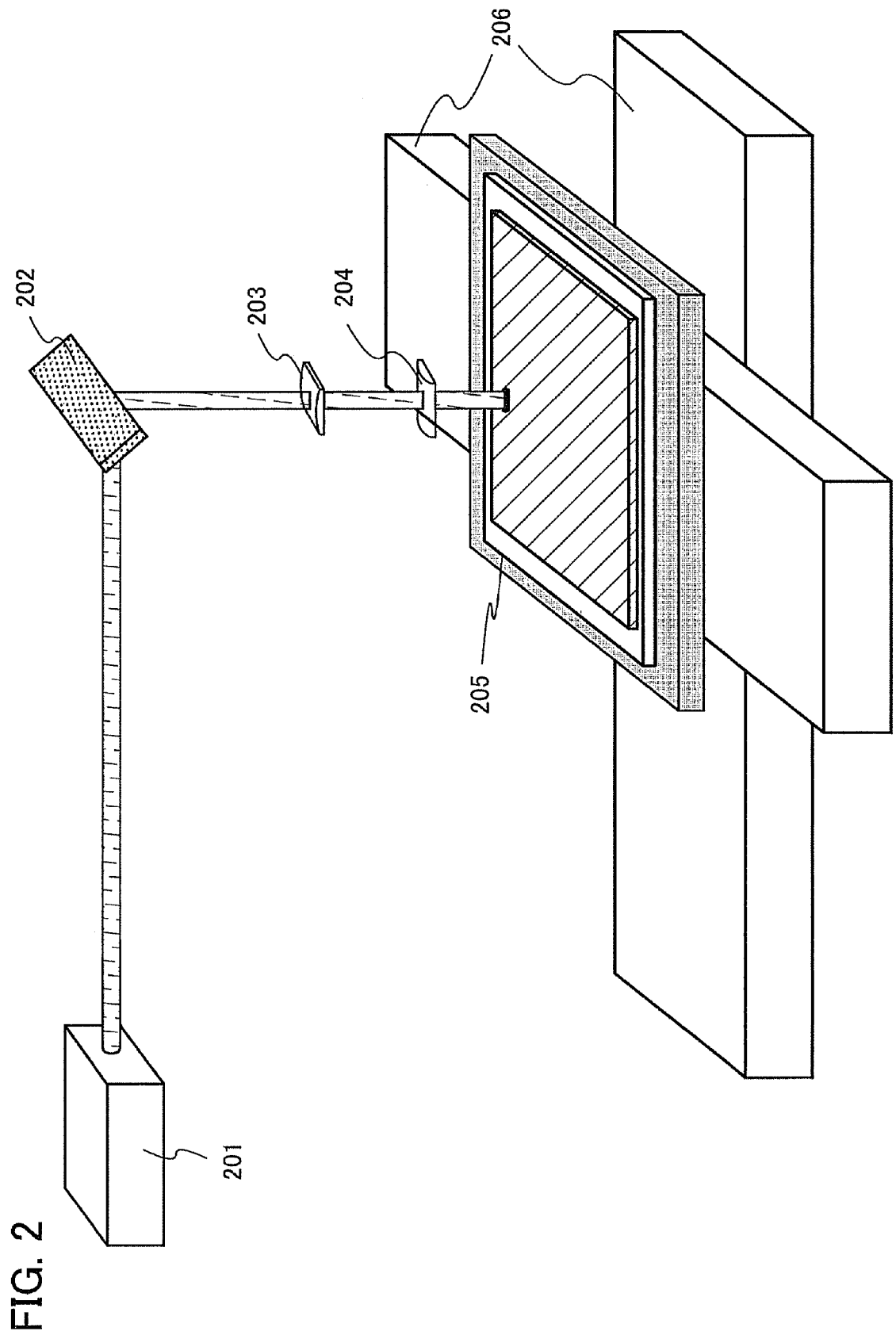
FIG. 2 is a diagram showing an optical device used in a manufacturing method of a semiconductor device in Embodiment Mode 1 of the present invention.

In FIG. 2, a laser oscillator 201 oscillates a femtosecond laser with a wavelength in the infrared region. A laser beam is emitted from the laser oscillator 201, and its direction is changed by a mirror 202 so that the laser beam perpendicularly reaches a glass substrate 205 that is a surface to be irradiated. Then, a linear beam is formed on the surface to be irradiated by a cylindrical lens 203 operating in a linear direction of the linear beam and a cylindrical lens 204 operating in a width direction of the linear beam.

The glass substrate 205 over which the cap film and the semiconductor film are formed is scanned from front to back and from side to side repeatedly using a XY stage 206 as appropriate, so that the semiconductor film can be crystallized.

Embodiment Mode 2

Hereinafter, another mode of a method for manufacturing a crystalline semiconductor film of the present invention and a method for manufacturing a thin film transistor using the crystalline semiconductor film will be described with reference to drawings. FIGS. 3A to 3E are diagrams illustrating a manufacturing method of the present invention.

Figure 3A:
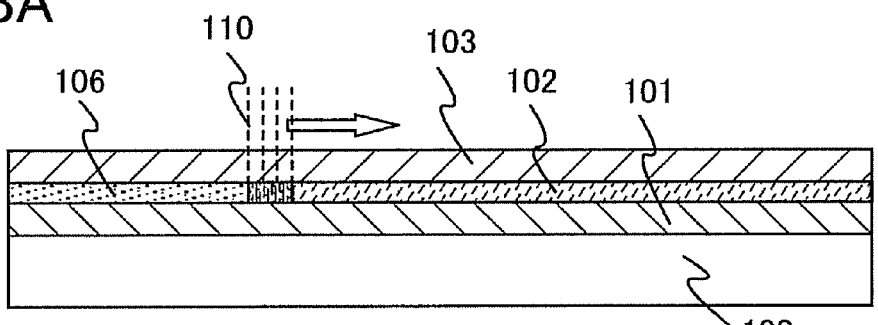
FIGS. 3A to 3E are diagrams illustrating a step of a manufacturing method of a semiconductor device in Embodiment Mode 2 of the present invention.
Figure 3B:
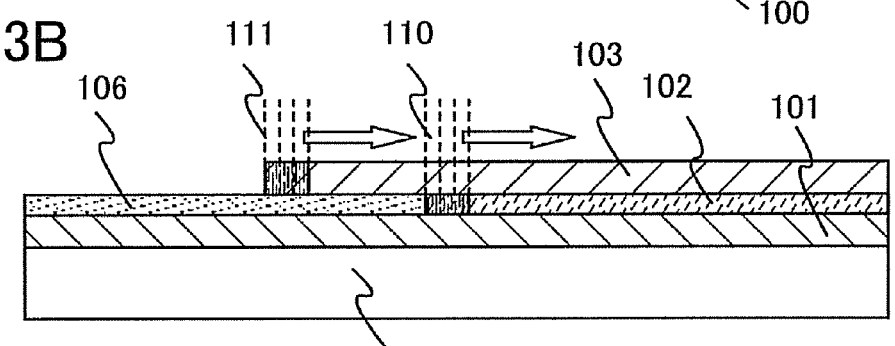
Figure 3C:
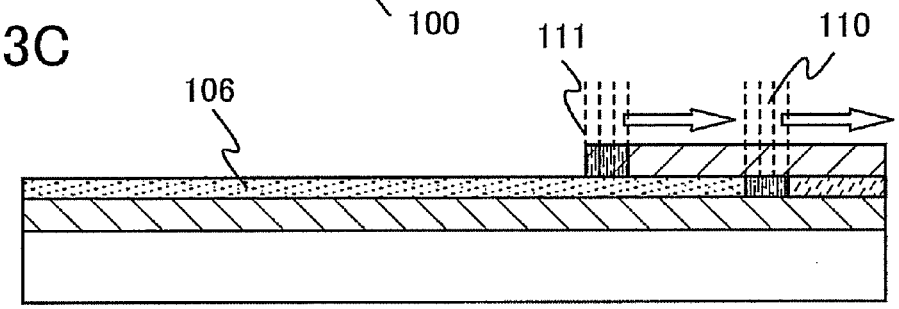

First, the substrate 100 is prepared, over which the insulating film 101, the semiconductor film 102, and the cap film 103 are sequentially formed by a described method with the use of FIG. 1A in Embodiment Mode 1. The substrate 100 is scanned by irradiation with a laser beam 110 for crystallization from above the cap film 103 as shown in FIG. 3A. As shown in FIGS. 3B and 3C, the substrate is irradiated in a scanning direction with a laser beam 111 of a femtosecond laser from behind the laser beam 110 for crystallization so that irradiation with the laser beam 111 is performed along with the irradiation with the laser beam 110. The semiconductor film 102 is crystallized by the laser beam 110, and the cap film 103 is removed by irradiation of the laser beam 111 immediately after the crystallization.

Irradiation is performed with a femtosecond laser of several mJ/cm$^2$ to several J/cm$^2$. The scanning speed of the substrate is preferably several ten mm/sec to several hundred mm/sec as same as the speed of crystallization.

Figure 3D:
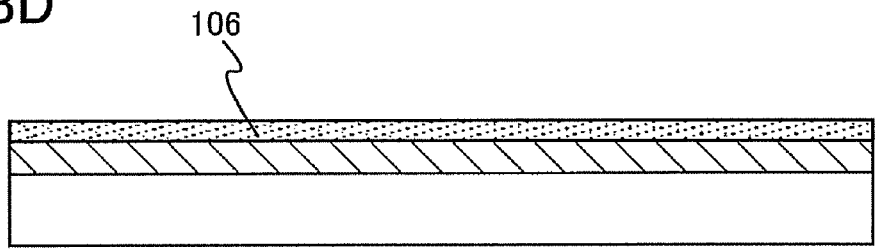

When the irradiation of the laser beams is finished, the portions to be crystallized in the semiconductor film 102 are crystallized, thereby forming a crystalline semiconductor film 106 as shown in FIG. 3D, and the cap film 103 located on the crystalline semiconductor film 106 is removed.

Here, the crystalline semiconductor film 106 is a semiconductor film including a crystallized region, such as a polycrystalline semiconductor film, a microcrystalline semiconductor film, or a semi-amorphous semiconductor film. In this embodiment mode, the crystalline semiconductor film preferably has a structure of the polycrystalline semiconductor film.

Figure 3E:
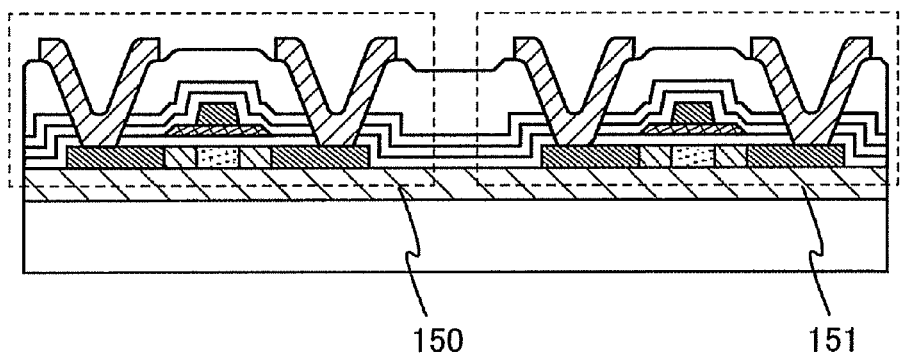

Next, as shown in FIG. 3E, channel regions and a source region and drain region are formed using the crystalline semiconductor film 106 in the normal process, so that a thin film transistor (TFT) 150 and a thin film transistor (TFT) 151 can be manufactured.

Note that before the manufacturing process of the thin film transistors is started, the thickness of the semiconductor film 102 may be reduced. Specifically, etching may be performed so as to reduce the thickness of the semiconductor film 102 to be greater than or equal to 10 nm and less than or equal to 30 nm. In the present invention, such a thin semiconductor film 102 can be crystallized by a laser because the laser irradiation is performed from above the cap film 103. When the thin film transistor is formed using such a thin crystalline semiconductor film 106, a fully depleted thin film transistor is obtained, so that a thin film transistor with high mobility can be formed.

As described above, after the crystallization of the semiconductor film with a normal laser, the femtosecond laser is continuously used behind from the laser for crystallization, so that only the cap film over the semiconductor film can be removed. By conducting the crystallization of the semiconductor film and removal of the cap film concurrently, time taken for the steps can be shortened. When the femtosecond laser is used for the removal of the cap film, a chemical solution and a gas used in the etching step is unnecessary, and the number of steps of treatment of the chemical solution and the gas can be reduced.

Next, a device used in this embodiment mode will be described with reference to FIG. 4.

Figure 4:
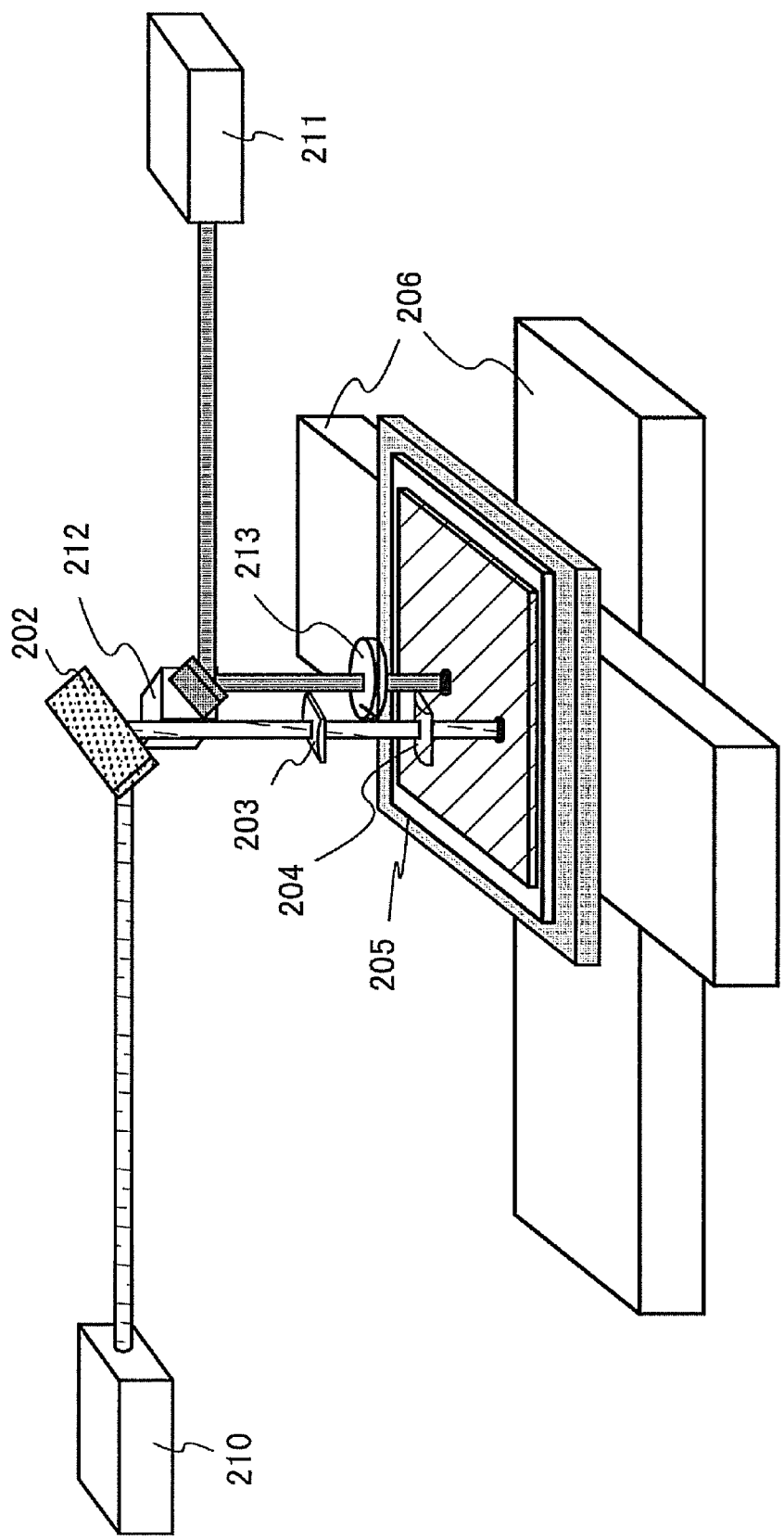
FIG. 4 is a diagram showing an optical device used in a manufacturing method of a semiconductor device in Embodiment Mode 3 of the present invention.

In FIG. 4, a first laser oscillator 210 that performs crystallization uses a laser with a wavelength of several ten % or more that is absorbed into a semiconductor film to be crystallized. A continuous wave or a pulsed laser with a repetition rate of 10 MHz or more is preferably used. For example, an Ar laser, a Kr laser, a $CO_2$ laser, or the like is given as a gas laser. A YAG laser, a YLF laser, a $YAlO_3$ laser, a $GdVO_4$ laser, a KGW laser, a KYW laser, an alexandrite laser, a Ti: sapphire laser, a $Y_2O_3$ laser, a $YVO_4$ laser, or the like is given as a solid laser. Moreover, there is a ceramic laser such as a YAG laser, a $Y_2O_3$ laser, a $GdVO_4$ laser, or a $YVO_4$ laser. As a metal vapor laser, a helium cadmium laser and the like can be given.

In addition, energy uniformity of a linear beam spot that can be obtained on the surface to be irradiated can be increased, when the laser beam is emitted with oscillation of $TEM_{00}$ (a single transverse mode), which is preferable.

A laser beam is emitted from the first laser oscillator 210, and its direction is changed by a mirror 202 so that the leaser beam perpendicularly reaches a glass substrate 205 that is a surface to be irradiated. Then, a linear beam is formed on the surface to be irradiated by a cylindrical lens 203 operating in a linear direction of the linear beam and a cylindrical lens 204 operating in a width direction of the linear beam.

On the other hand, a second laser oscillator 211 that removes the cap film is a laser oscillator that oscillates a femtosecond laser with a wavelength in an infrared region. A laser beam is emitted from the laser oscillator, and its direction is changed by a galvanic scanner 212 so that the glass substrate 205 that is a surface to be irradiated is irradiated with the laser beam. Then, the laser beam is condensed on the surface to be irradiated by a fθ lens 213, and a beam spot is formed.

The glass substrate 205 over which the cap film and the semiconductor film are formed is scanned from front to back and from side to side repeatedly using a XY stage 206 as appropriate, whereby the semiconductor film can be crystallized concurrently with removal of the cap film.

A portion irradiated with the laser beam that is oscillated from the second oscillator is changed by the galvanic scanner 212, depending on the scanning direction of the substrate. The substrate is always irradiated with the second laser beam after the semiconductor film is crystallized by the first laser beam, so that the cap film is removed.

A form of spot on the irradiated surface with the laser beam that is oscillated from the second oscillator is not particularly defined. However, it is preferred that the spot size is the approximately same with the length direction of the linear beam of the first laser.

Embodiment 1

This embodiment will describe an example in which crystallization of an amorphous semiconductor film and removal of a cap film are performed at the same time with the femtosecond laser used in the manufacturing method of a crystalline semiconductor thin film shown in Embodiment Mode 1 of the present invention, with reference to drawings.

First, samples were manufactured by a method described below. As a base film, a silicon nitride oxide film with a thickness of 50 nm was formed over a glass substrate by a plasma CVD method, and then, a silicon oxynitride film with a thickness of 100 nm was formed by a plasma CVD method. Next, an amorphous silicon film was formed over the base film by a plasma CVD method, and SiNO with a thickness of 300 nm was deposited as a cap film over the amorphous silicon film by a plasma CVD method. In such a manner, three kinds of amorphous silicon films with a thickness of 20 nm, 25 nm, and 30 nm as samples were manufactured. The SiNO contains Si of 32.2%, O of 5.2%, N of 45.5%, and H of 17.2%. Note that a sample in which an amorphous silicon film with a thickness of 20 nm was formed and a cap film was not formed was manufactured as a comparative example.

A laser oscillator was used, which oscillates a laser with a wavelength of 795 nm (±15 nm) and a pulse width of 50 f (femto) seconds. In an optical system, a fθ lens and a galvanic scanner were used, and a spot diameter was set to be 10 μm. The laser is focused on the surface of the cap film, so that the cap film and the amorphous silicon film are within the focal depth.

A defined section of each sample was irradiated with laser light by adjusting the scanning speed of the galvanic scanner so that one shot could be confirmed. The energy density of laser light was 2.7 J/cm$^2$ to the sample including the amorphous silicon film with a thickness of 20 nm, 2.7 J/cm$^2$ to the sample including the amorphous silicon film with a thickness of 25 nm, 3.6 J/cm$^2$ to the sample including the amorphous silicon film with a thickness of 30 nm, and 0.9 J/cm$^2$ to the sample without the cap film.

Each sample after irradiation with laser light was observed by an optical microscope and Raman spectroscopic measurement was conducted. Results of the sample including the 20-nm-thick amorphous silicon film, the sample including the 25-nm-thick amorphous silicon film, the sample including the 30-nm-thick amorphous silicon film, and the sample without the cap film are shown in FIGS. 5A and 5B, FIGS. 6A and 6B, FIGS. 7A and 7B, and FIGS. 19A and 19B, respectively. FIGS. 5A, 6A, 7A, and 19A are observation photographs by the optical microscope. FIGS. 5B, 6B, 7B, and 19B show results of analysis by the Raman spectroscopic measurement in which each horizontal axis indicates a wavenumber (cm$^{-1}$) and each vertical axis indicates Raman intensity.

Figure 5A:
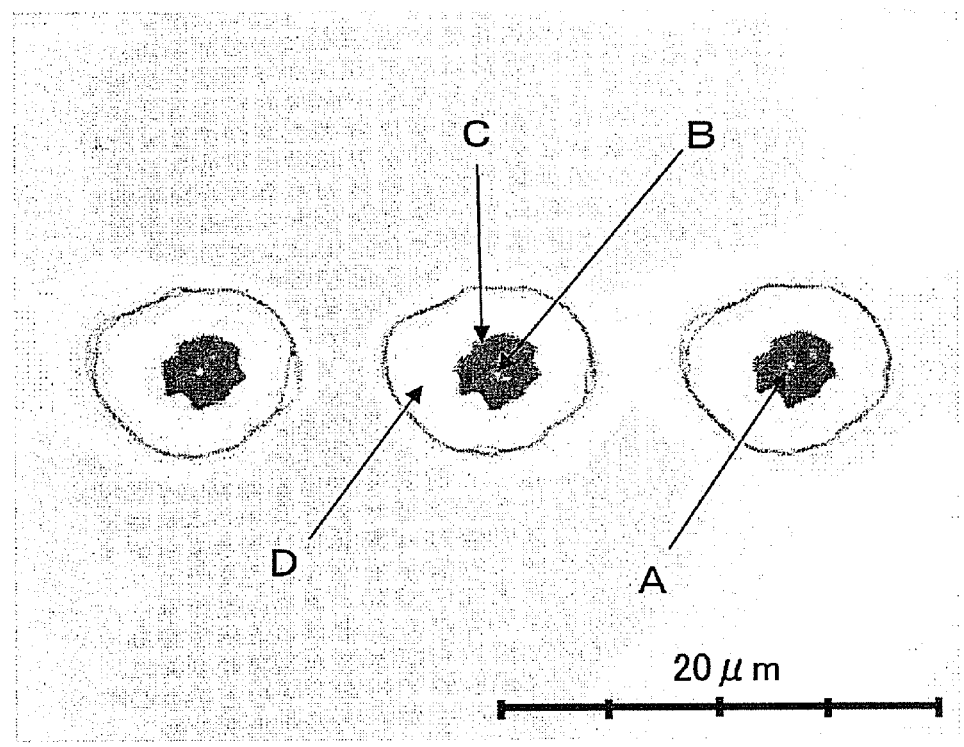
FIG. 5A is a photograph showing an observation result of a sample in Embodiment 1 of the present invention.
Figure 5B:
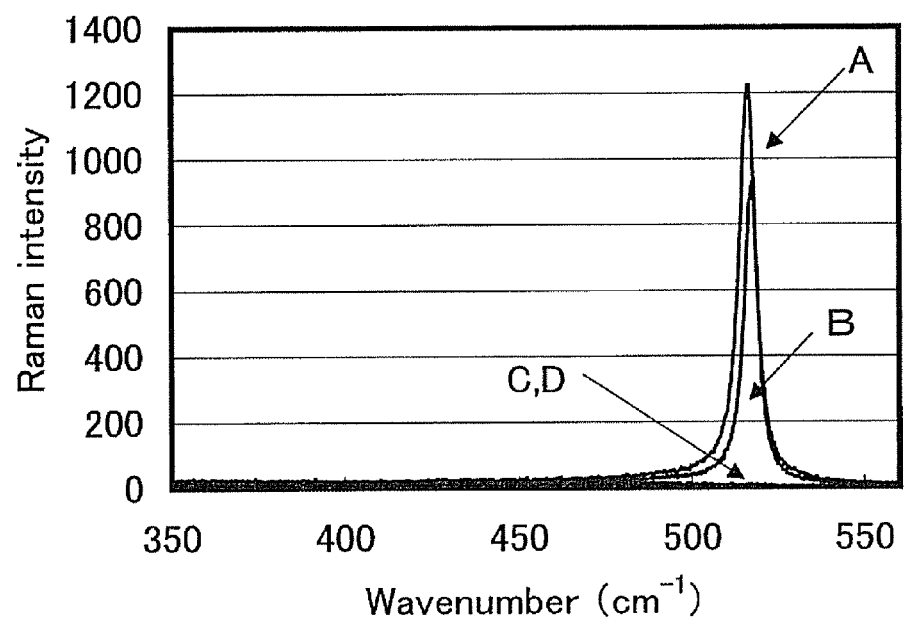
FIG. 5B is a graph thereof.

In accordance with FIGS. 5A and 5B showing the result of the sample including the 20-nm-thick amorphous silicon film, the following result can confirm that by the result of the Raman spectroscopic measurement (FIG. 5B), peaks of polycrystalline silicon (wavenumber of 520 cm$^{-1}$) are found in center portions (points A and B in FIG. 5A) irradiated with laser, and the peak of polycrystalline silicon is not found in other portions (points C and D in FIG. 5A).

Thus, it is found that the amorphous silicon is crystallized and the cap film is removed in the center portion irradiated with laser light.

Figure 6A:
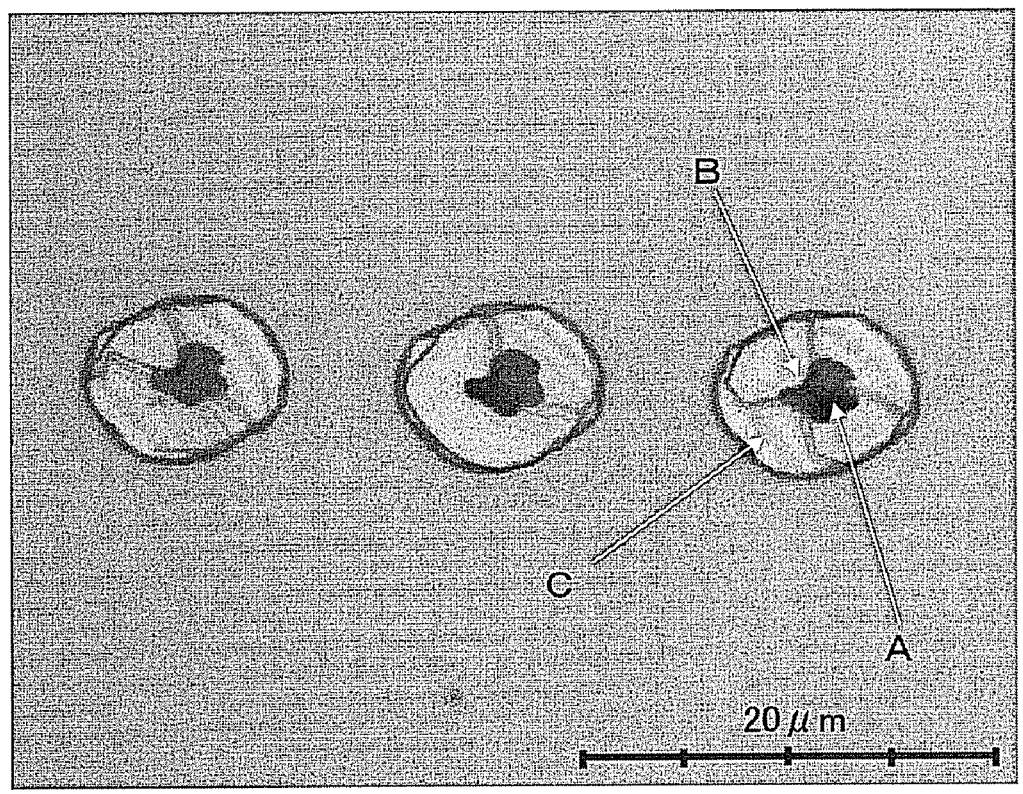
FIG. 6A is a photograph showing an observation result of a sample in Embodiment 1 of the present invention.
Figure 6B:
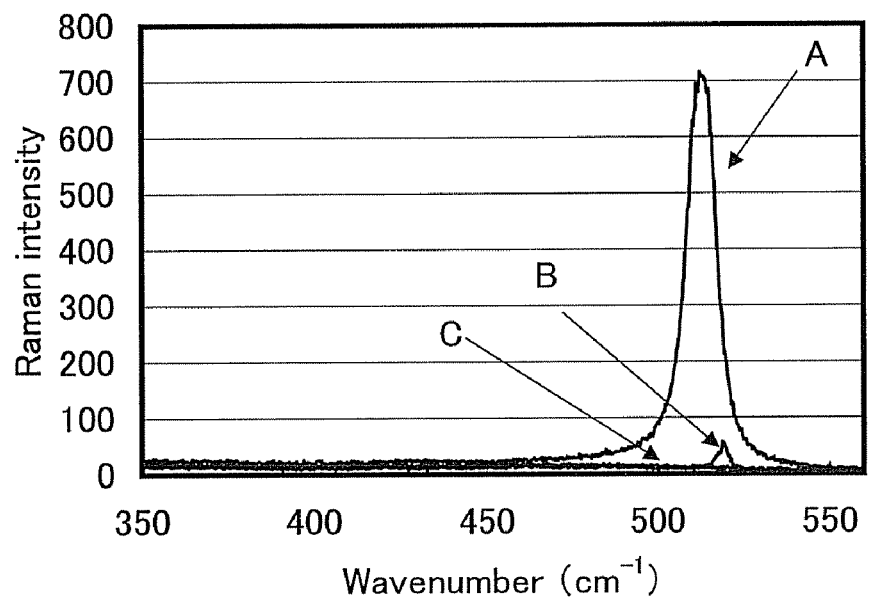
FIG. 6B is a graph thereof.

Similarly, FIGS. 6A and 6B showing the result of the sample including the 25-nm-thick amorphous silicon film can confirm that by the result of the Raman spectroscopic measurement (FIG. 6B), a peak of polycrystalline is found in a center portion (a point A in FIG. 6A) irradiated with a laser, and a peak of polycrystalline silicon is not found in other portions (points B and C in FIG. 6A).

Figure 7A:
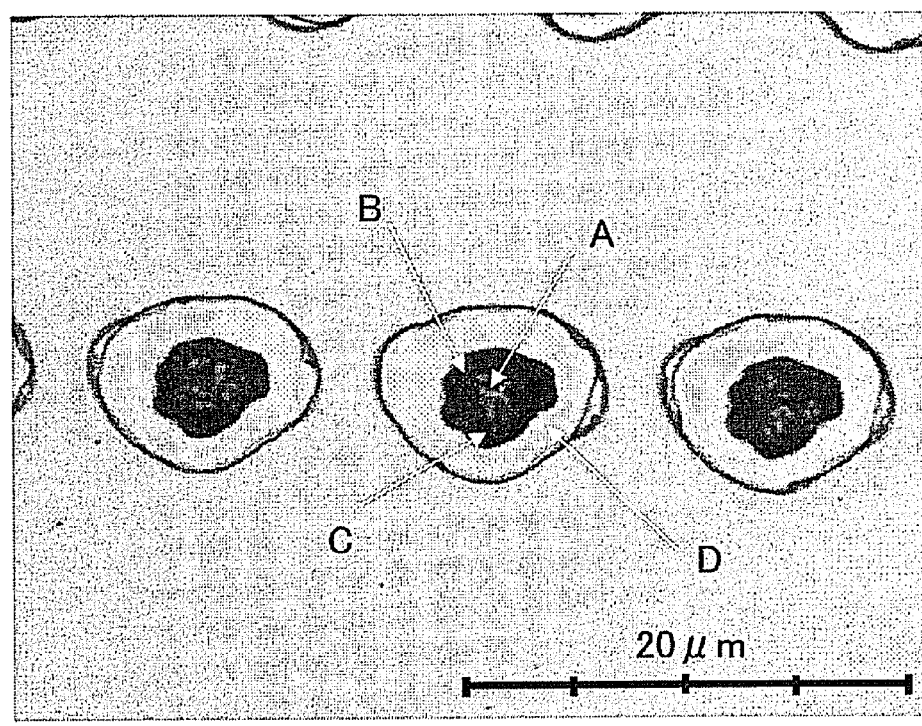
FIG. 7A is a photograph showing an observation result of a sample in Embodiment 1 of the present invention.
Figure 7B:
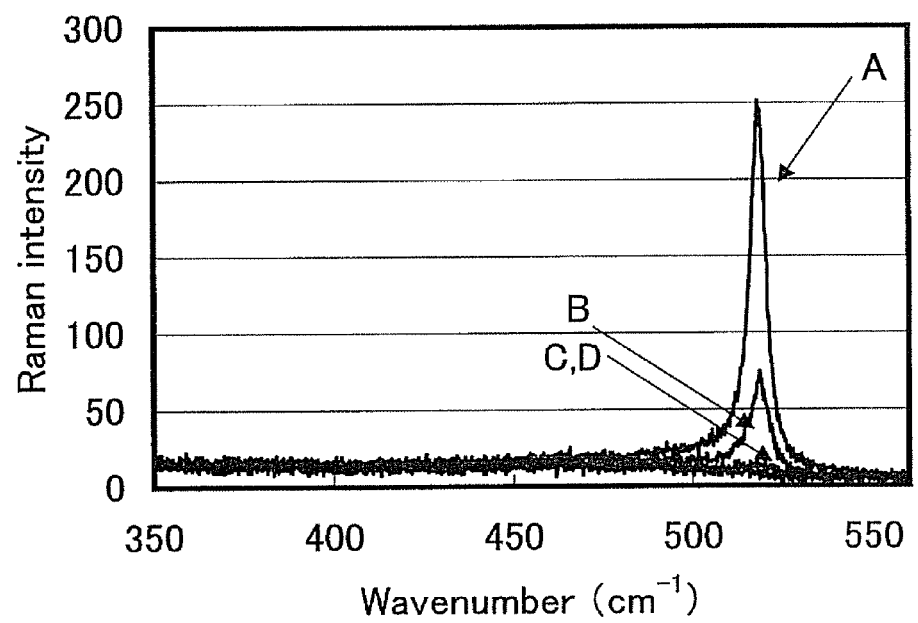
FIG. 7B is a graph thereof.

FIGS. 7A and 7B showing the result of the sample including the 30-nm-thick amorphous silicon film can confirm that by the result of Raman spectroscopic measurement (FIG. 7B), peaks of polycrystalline silicon are found in center portions (points A and B in FIG. 7A) irradiated with a laser, and a peak of polycrystalline silicon is not found in other portions (points C and D in FIG. 7A).

Figure 19A:
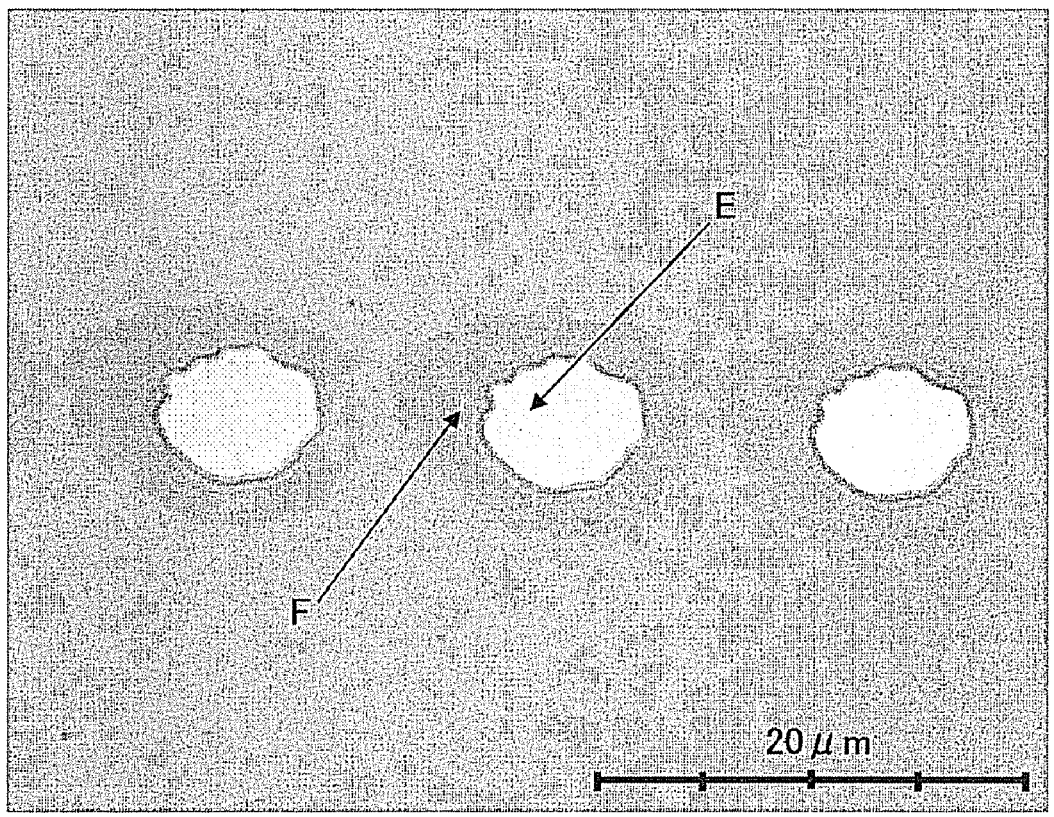
FIG. 19A is a photograph showing an observation result of a sample in Embodiment 1 of the present invention.
Figure 19B:
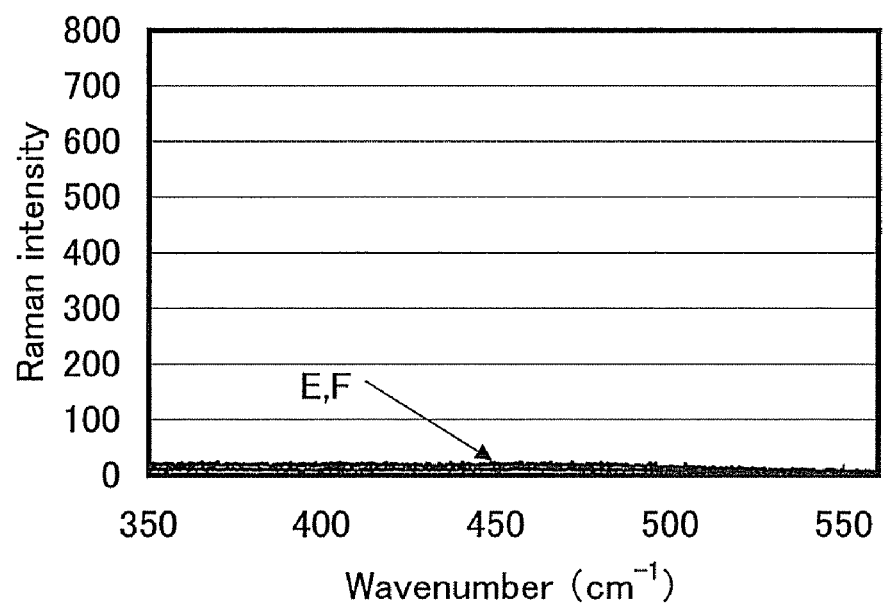
FIG. 19B is a graph thereof.

However, FIGS. 19A and 19B showing the result of the sample without the cap film can confirm that by the result of Raman spectroscopic measurement (FIG. 19B), a peak of polycrystalline silicon is not found in both a center portion (point E in FIG. 19A) irradiated with laser and other portions (point F in FIG. 19A). It is considered that in the center portion (point E in FIG. 19A), the cap film and the amorphous silicon film are ablated; and in the other portions (point F in FIG. 19A), the cap film and the amorphous silicon film rise by influence of ablation of the center portion by irradiation with laser beam.

Thus, it is found that when the amorphous silicon film is directly irradiated with laser without the cap film, the amorphous silicon film in a portion irradiated with laser is not crystallized.

Embodiment 2

This embodiment will describe an example of a method for manufacturing an active matrix substrate using the semiconductor film of a manufacturing method which is shown in Embodiment Mode 1 or 2 of the present invention, with reference to drawings. FIGS. 8A to 11 are process diagrams of a method for manufacturing an active matrix substrate in this embodiment.

In FIG. 8A, a substrate 700 is made of glass such as barium borosilicate glass or aluminoborosilicate glass typified by #7059 glass or #1737 glass manufactured by Corning, Inc. Note that the substrate 700 may be a quartz substrate, silicon substrate, a metal substrate, or a stainless substrate having a surface provided with an insulating film. Furthermore, a plastic substrate which can withstand the processing temperature of this embodiment may be used.

Next, a base film 701 formed of an insulating film such as a silicon oxide film, a silicon nitride film, or a silicon oxynitride film is formed over the substrate 700. Although the base film 701 has a two-layer structure in this embodiment, the insulating film may be a single film or have a stacked structure with two or more layers. As a first layer of the base film 701, a silicon oxynitride film 701a is formed to have a thickness of 10 to 200 nm (preferably, 50 to 100 nm), using SiH$_4$, NH$_3$, and N$_2$O as reaction gases by a plasma CVD method. In this embodiment, a silicon oxynitride film 701a with a thickness of 50 nm (composition ratio: Si=32%, O=27%, N=24%, H=17%) is formed. Then, as a second layer of the base film 701, a silicon oxynitride film 701b is formed to have a thickness of 50 to 200 nm (preferably, 100 to 150 nm), using SiH$_4$ and N$_2$O as reaction gases by a plasma CVD method. In this embodiment, a silicon oxynitride film 701b with a thickness of 100 nm (composition ratio: Si=32%, O=59%, N=7%, H=2%) is formed.

Next, a semiconductor film 702 is formed over the base film 701. The semiconductor film 702 is formed to have an amorphous structure with a thickness of 20 to 80 nm by a known method (such as a sputtering method, an LPCVD method, or a plasma CVD method). A material of the semiconductor film is not limited, and the semiconductor film is preferably formed using silicon or a silicon germanium (SiGe) alloy. In this embodiment, an amorphous silicon film with a thickness of 30 nm is formed by a plasma CVD method.

Then, a cap film 703 is formed over the semiconductor film 702. As the cap film 703, SiON is deposited to have a thickness of 300 nm by a plasma CVD method.

Then, as shown in FIG. 8B, the semiconductor film 702 is crystallized to form a crystalline semiconductor film 801 and the cap film 703 is removed together by a method for manufacturing a crystalline semiconductor film shown in Embodiment Mode 1 or 2. As laser light, a femtosecond laser with a wavelength of 795 nm (±15 nm) and a pulse width 50 f (femto) seconds is used, and the energy density thereof is set to be 2.7 J/cm$^2$.

Next, as shown in FIG. 8C, the crystalline semiconductor film that is obtained by a laser crystallization method is patterned into a desired shape, thereby forming semiconductor layers 802 to 806.

After formation of the semiconductor layers 802 to 806, doping of a minute amount of impurity elements (boron or phosphorus) may be performed in order to control the threshold value of TFTs.

Next, a gate insulating film 807 with which the semiconductor layers 802 to 806 are covered is formed. The gate insulating film 807 is formed using an insulating film containing silicon with a thickness of 40 to 150 nm by a plasma CVD method or a sputtering method. In this embodiment, a silicon oxynitride film (composition ratio: Si=32%, O=59%, N=7%, H=2%) with a thickness of 110 nm is formed by a plasma CVD method. Naturally, the gate insulating film is not limited to a silicon oxynitride film, and the gate insulating film may be another insulating film containing silicon of a single layer or a stacked structure.

In the case of using a silicon oxide film, TEOS (tetraethyl Orthosilicate) and O$_2$ are mixed by a plasma CVD method, and discharge is performed under conditions where a reaction pressure is 40 Pa, a substrate temperature is 300 to 400° C., and a high frequency (13.56 MHz) power density is 0.5 to 0.8 W/cm$^2$, so that the silicon oxide film can be formed. The silicon oxide film manufactured in such a manner can obtain favorable characteristics as the gate insulating film by thermal annealing of 400 to 500° C. afterward.

Next, a first conductive film 808 with a thickness of 20 to 100 nm and a second conductive film 809 with a thickness of 100 to 400 nm are stacked over the gate insulating film 807. In this embodiment, a first conductive film 808 formed of a tantalum nitride film with a thickness of 30 nm and a second conductive film 809 formed of a W film with a thickness of 370 nm are stacked. The tantalum nitride film is formed by a sputtering method using Ta as a target in an atmosphere containing nitrogen. The W film is formed by a sputtering method using W as a target. Further, the W film can be formed by a thermal CVD method using tungsten hexafluoride (WF$_6$). In any case, it is necessary that resistance is to be lowered for using the first and second conductive films as a gate electrode, and resistivity of the W film is desirably set to be 20 μΩcm or less. In the W film, resistivity can be attempted to be lowered by increasing sizes of crystal grains; however, when the large amount of impurity elements such as oxygen are included in the W film, the crystallization is inhibited, and resistivity is increased. Accordingly, in this embodiment, the W film is formed by a sputtering method using W with high purity (purity of 99.9999%) as a target and by sufficiently considering that impurities are not entered from a vapor phase in deposition, so that resistivity of 9 to 20 μΩcm could be achieved.

Although the first conductive film 808 is tantalum nitride and the second conductive film 809 is W in this embodiment, materials of the first and second conductive films are not particularly limited, and each of the conductive films may be formed using an element selected from Ta, W, Ti, Mo, Al, Cu, Cr, or Nd, or an alloy material or a compound material containing an element as listed above as its main component. Further, a semiconductor film may be used, which is typified by a crystalline silicon film doped with an impurity element such as phosphorus. An AgPdCu alloy may be used. Furthermore, the following combinations of films may be employed: a combination of a tantalum (Ta) film as the first conductive film and a W film as a second conductive film; a combination of a titanium nitride film as the first conductive film and a W film of the second conductive film; a combination of a titanium nitride film as the first conductive film and a W film as the second conductive film; a combination of a tantalum nitride film as the first conductive film and an Al film as the second conductive film; or a combination of a tantalum nitride film as the first conductive film and a Cu film as the second conductive film.

Next, as shown in FIG. 8D, resist masks 810 to 815 are formed using a photolithography method, and first etching treatment for forming electrodes and wirings is performed. The first etching treatment is performed under first and second etching conditions. In this embodiment, an ICP (Inductively Coupled Plasma) etching method is used as the first etching condition. Etching is performed as follows: as etching gases, CF$_4$, Cl$_2$, and O$_2$ with gas flow rate of 25/25/10 (sccm), respectively, are used; and RF (13.56 MHz) power of 500 W is supplied to a coiled electrode with pressure of 1 Pa to generate plasma. Here, a dry etching device using ICP manufactured by Matsushita Electric Industrial Co., Ltd. (Model E645-square ICP) is used. RF (13.56 MHz) power of 150 W is supplied to a substrate side (sample stage), so that a negative self-bias voltage is applied. By this first etching condition, the W film is etched to form the first conductive layer whose end portion is a tapered shape.

After that, etching is performed for about 30 seconds under the second etching condition without removing the resist masks 810 to 815, in which as the etching gases, CF$_4$ and Cl$_2$ with gas flow rate of 30/30 (sccm), respectively are used, and RF (13.56 MHz) power of 500 W is supplied to a coiled electrode with pressure of 1 Pa to generate plasma. RF (13.56 MHz) power of 20 W is supplied to the substrate side (sample stage), and a negative self-bias is applied. In the second etching condition in which CF$_4$ and Cl$_2$ are mixed, both the W film and the tantalum nitride film are etched to the same extent. In order to perform etching so as not to leave residues on the gate insulating film, etching time is preferably increased by approximately 10 to 20%.

In the first etching treatment, by forming the resist masks into suitable shapes, end portions of the first and second conductive layers become tapered shapes due to effect of the bias voltage applied to the substrate side. The angle of the tapered portion is 15° to 45°. Thus, conductive layers 817 to 822 (first conductive layers 817a to 822a and second conductive layers 817b to 822b) in first shapes are formed of the first conductive layer and the second conductive layer by the first etching treatment. Reference numeral 816 denotes a gate insulating film, and regions which are not covered with the conductive layers 817 to 822 in first shapes are etched by approximately 20 to 50 nm to be thin.

Figure 9A:
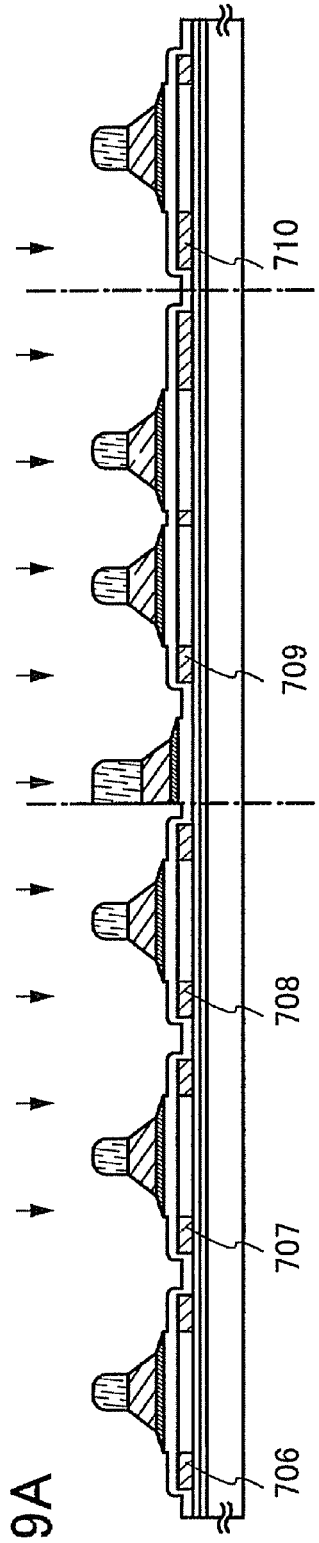
FIGS. 9A to 9C are cross-sectional views illustrating a manufacturing step of an active matrix substrate in Embodiment 2 of the present invention.

Then, as shown in FIG. 9A, first doping treatment is performed without removing the resist masks, and an impurity element imparting n-type conductivity is added to the semiconductor layers. The doping treatment may be conducted by an ion doping method or an ion implanting method. An ion doping method is performed with the dose of $1\times10^{13}$ to $5\times10^{15}$/cm$^2$ at an accelerating voltage of 60 to 100 keV. In this embodiment, the dose is $1.5\times10^{15}$/cm$^2$, and the accelerating voltage is 80 keV.

An element belonging to Group 15 of the periodic table, typically, phosphorus (P) or arsenic (As) is used as the impurity element imparting n-type conductivity, but phosphorus (P) is used here. In this case, the conductive layers 817 to 821 function as masks to the impurity element imparting n-type conductivity, and first high concentration impurity regions 706 to 710 are formed in a self-aligned manner. In the first high concentration impurity regions 706 to 710, the impurity element imparting n-type conductivity is added within a concentration range of $1\times10^{20}$ to $1\times10^{21}$/cm$^2$.

Next, second etching treatment is performed without removing the resist masks. Here, CF$_4$, Cl$_2$, and O$_2$ are used as etching gases, and the W film is etched as selected. At this time, second conductive layers 828b to 833b are formed by the second etching treatment. On the other hand, the first conductive layers 817a to 822a are hardly etched, so that conductive layers 828 to 833 in second shapes are formed.

Figure 9B:
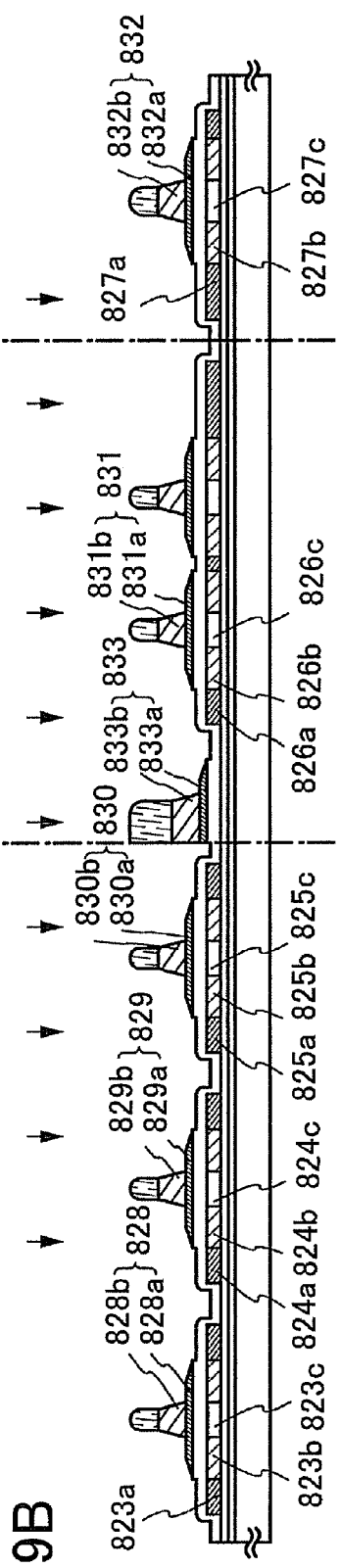

After that, as shown in FIG. 9B, second doping treatment is performed without removing the resist masks. In this case, the dose is reduced as compared with that of the first doping treatment, and the impurity element imparting n-type conductivity is introduced at a high accelerating voltage of 70 to 120 keV. In this embodiment, the dose is $1.5\times10^{14}$/cm$^2$, and the accelerating voltage is 90 keV. In the second doping treatment, the conductive layers 828 to 833 in second shapes are used as masks, and the impurity element is introduced into the semiconductor layer below the second conductive layers 828b to 833b, so that high concentration impurity regions 823a to 827a and low concentration impurity regions 823b to 827b are formed.

Figure 9C:
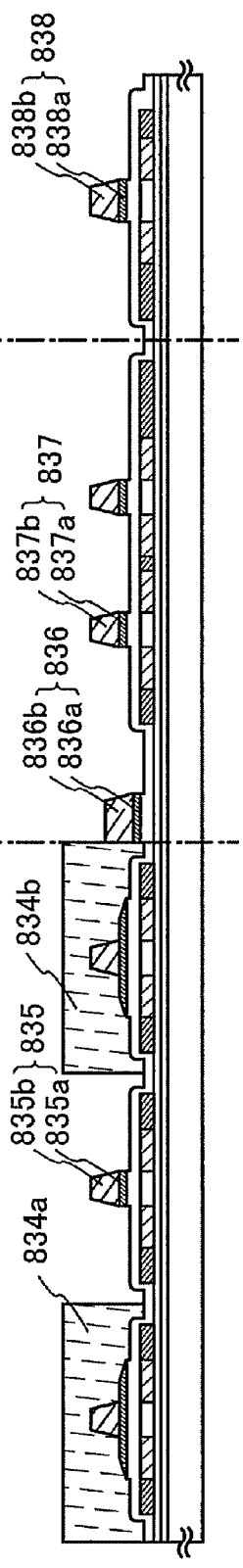

After the resist masks are removed, resist masks 834a and 834b are newly formed, and third etching treatment is performed as shown in FIG. 9C. The etching treatment is performed for about 30 seconds as follows: SF$_6$ and Cl$_2$ are used as etching gases with gas flow rate of 50/10 (sccm), respectively; and RF (13.56 MHz) power of 500 W is supplied to a coiled electrode with a pressure of 1.3 Pa to generate plasma. RF (13.56 MHz) power of 10 W is supplied to the substrate side (sample stage), and a negative self-bias voltage is applied. Thus, tantalum nitride films of a p-channel TFT and TFTs in a pixel portion (pixel TFT) are etched by the third etching treatment, so that conductive layers 835 to 838 in third shapes are newly formed.

As shown in FIG. 10A, after the resist masks are removed, the conductive layers 828 and 830 in second shapes and the conductive layers 835 to 838 in second shapes are used as masks, and the gate insulating film 816 is removed as selected, so that insulating layers 839 to 844 are formed.

Next, as shown in FIG. 10B, resist masks 845a to 845c are newly formed, and third doping treatment is performed. By the third doping treatment, an impurity element imparting opposite type conductivity to the above conductivity type is added to the semiconductor layers that are to be activation layers of the p-channel TFTs, so that impurity regions 846a to 846c and 847a to 847c and channel formation regions 846d and 847d are formed. The second conductive layers 835a and 838a are used as masks to the impurity element, and an impurity element imparting p-type conductivity is added, whereby impurity regions are formed in a self-aligned manner. In this embodiment, the impurity regions 846a to 846c and 847a to 847c are formed by an ion doping method using diborane (B$_2$H$_6$). In the third doping treatment, the semiconductor layers included in n-channel TFTs are covered with the masks 845a to 845c. By the first doping treatment and the second doping treatment, the impurity regions 846a to 846c and 847a to 847c are doped with phosphorus with different concentrations from each other. However, the doping treatment is conducted so that each region can have a concentration of the impurity element imparting p-type conductivity of $2\times10^{20}$ to $2\times10^{21}$/cm$^3$, whereby there is no problem for serving the regions as a source region and a drain region of the p-channel TFT. In this embodiment, since the semiconductor layers to be activation layers of the p-channel TFTs are partially exposed, there is an advantage in that the impurity element (boron) is easily added.

Through the above steps, impurity regions are formed in each semiconductor layer.

Next, the resist masks 845a to 845c are removed, and a first interlayer insulating film 861 is formed. The first interlayer insulating film 861 is formed using an insulating film containing silicon with a thickness of 100 to 200 nm by a plasma CVD method or a sputtering method. In this embodiment, a silicon oxynitride film with a thickness of 150 nm is formed by a plasma CVD method. As a matter of course, the first interlayer insulating film 861 is not limited to the silicon oxynitride film, and may be another insulating film containing silicon of a single layer or a stacked structure.

Next, as shown in FIG. 10C, by heating treatment, recovery of crystalline of the semiconductor layers and activation of the impurity elements added to each semiconductor layer are performed. This heat treatment is conducted by a thermal annealing method using an annealing furnace. A thermal annealing method may be conducted in a nitrogen atmosphere in which the oxygen concentration is 1 ppm or less, preferably, 0.1 ppm or less, at 400 to 700° C., typically, 500 to 550° C. In this embodiment, activation of the impurity elements is performed by heat treatment at 550° C. for four hours. Other than a thermal annealing method, a laser annealing method or a rapid thermal annealing method (RTA method) can be applied. In the case of a laser annealing method, a method described in the embodiment modes of the present invention may be employed; however, ablation in the gate and the like may occur depending on the given energy density, and it is necessary to pay attention to the conditions.

Before the first interlayer insulating film 861 is formed, heating treatment may be performed. However, in a case where an used wiring material is weak to heat, activation treatment is preferably performed after an interlayer insulating film (an insulating film containing silicon as its main component, e.g., a silicon nitride film) is formed so as to protect a wiring and the like as this embodiment.

In addition, heating treatment is performed in an atmosphere containing hydrogen of 3 to 100% at 300 to 550° C. for 1 to 12 hours, whereby a step of hydrogenating the semiconductor layers is performed. In this embodiment, heating treatment is performed in a nitrogen atmosphere containing hydrogen of about 3% at 410° C. for one hour. This step is for terminating dangling bonds of the semiconductor layers by hydrogen contained in the interlayer insulating film. As another method of hydrogenation, plasma hydrogenation (using hydrogen excited by plasma) may also be performed.

In the case using a conventional laser annealing method as activation treatment, after the above hydrogenation is performed, the semiconductor layers are desirably irradiated with a laser beam such as an excimer laser or a YAG laser.

Figure 11:
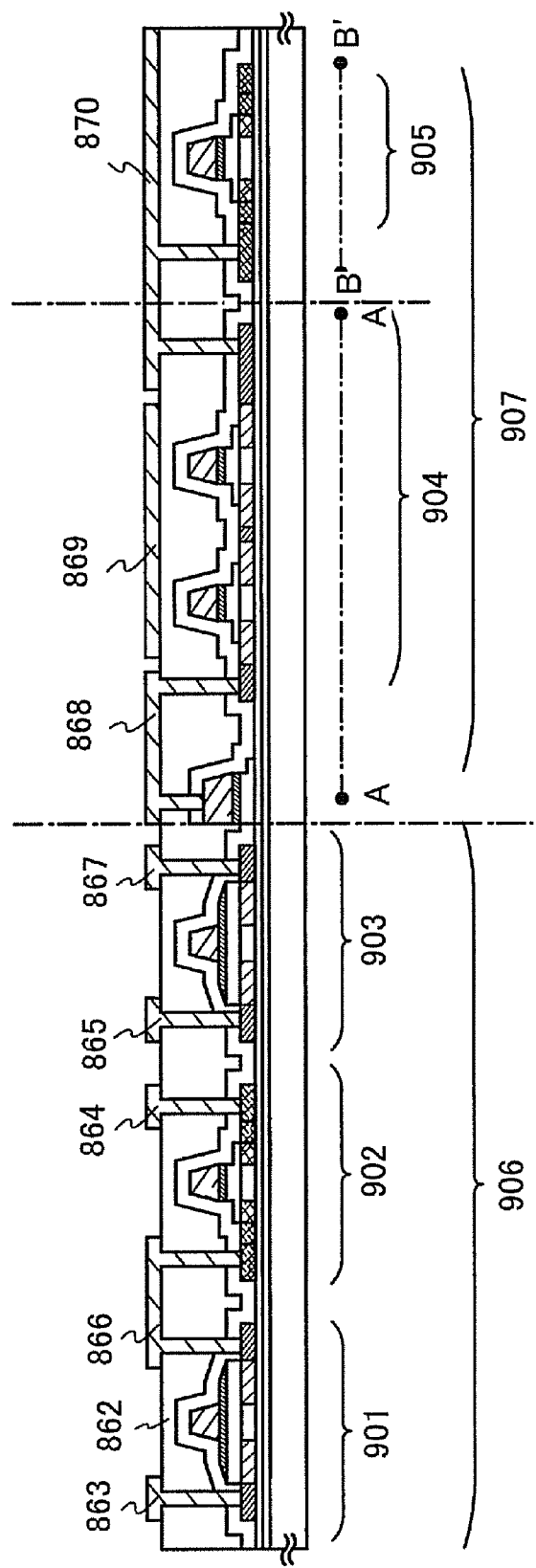
FIG. 11 is a cross-sectional view illustrating a manufacturing step of an active matrix substrate in Embodiment 2 of the present invention.

Next, as shown in FIG. 11, a second interlayer insulating film 862 is formed using an inorganic insulating material or an organic insulating material over the first interlayer insulating film 861. In this embodiment, an acrylic resin film with a thickness of 1.6 μm whose viscosity is 10 to 1000 cp, preferably, 40 to 200 cp, and surface has a depression and projection, is formed.

In this embodiment, in order to prevent specular reflection, the second interlayer insulating film whose surface has a depression and a projection is formed, whereby a depression and a projection are formed on a surface of a pixel electrode. In order to have a light scattering property by forming a depression and a projection on the surface of the pixel electrode, a projection may be formed in a region in a lower part of the pixel electrode. In that case, the projection can be formed using the same photomask as that in formation of the TFTs; therefore, the number of steps is not increased. Note that this projection may be provided, as appropriate, over the substrate in the pixel region other than the wiring and TFT portions. Thus, a depression and a projection are formed on the surface of the pixel electrode along with the depression and the projection formed on the surface of the insulating film with which the projection is covered.

Alternatively, a film for planarizing a surface may be used as the second interlayer insulating film 862. In that case, after the pixel electrode is formed, a depression and a projection are formed on a surface by adding a known step such as a sandblast method, an etching method, or the like, so that specular reflection is prevented and reflection light is scattered, whereby whiteness degree is preferably increased.

Then, in a driver circuit 906, wirings 863 to 867 each of which is electrically connected to each impurity region are formed. Theses wirings are formed by patterning a stacked film of a Ti film with a thickness of 50 nm and an alloy film (an alloy film of Al and Ti) with a thickness of 500 nm.

In a pixel portion 907, a pixel electrode 870, a gate wiring 869, and a connection electrode 868 are formed. With this connection electrode 868, a source wiring is electrically connected to the pixel TFT. The gate wiring 869 is electrically connected to a gate electrode of the pixel TFT. The pixel electrode 870 is electrically connected to a drain region of the pixel TFT. In addition, the pixel electrode 870 is electrically connected to the semiconductor layer functioning as one of electrodes included in a storage capacitor. As the pixel electrode 870, a film containing Al or Ag as its main component or a material having superiority in reflectivity such as a stacked film of Al or Ag is preferably used.

In such a manner, the driver circuit 906 comprising a CMOS circuit including an n-channel TFT 901 and a p-channel TFT 902, and an n-channel TFT 903; and a pixel portion 907 comprising a pixel TFT 904 and a storage capacitor 905 can be formed over the same substrate. Thus, an active matrix substrate is completed.

The n-channel TFT 901 of the driver circuit 906 has a channel formation region 823c, the low concentration impurity region 823b (GOLD region) overlapping with the first conductive layer 828a that is partially included in the gate electrode, and the high concentration impurity region 823a functioning as a source or drain region. This n-channel TFT 901 is connected to the p-channel TFT 902 through the electrode 866, whereby the CMOS circuit is formed. This p-channel TFT 902 has a channel formation region 846d, the impurity regions 846b and 846c formed outside the gate electrode, and a high concentration impurity region 846a functioning as a source or drain region. The n-channel TFT 903 has a channel formation region 825c, a low concentration impurity region 825b (GOLD region) overlapping with the first conductive layer 830a that is partially included in the gate electrode, and a high concentration impurity region 825a functioning as a source or drain region.

The pixel TFT 904 of the pixel portion has a channel formation region 826c, a low concentration impurity region 826b (LDD region) formed outside the gate electrode, and a high concentration impurity region 826a functioning as a source or drain region. An impurity element imparting p-type conductivity is added to each of semiconductor layers 847a and 847b functioning as one of electrodes of the storage capacitor 905. The storage capacitor 905 includes the insulating film 844 as a dielectric body, the electrode (stacked layer of 838a and 838b), and the semiconductor layers 847a to 847c.

In the pixel structure of this embodiment, an end portion of the pixel electrode is arranged to overlap with the source wiring so as not to pass light through a space between the pixel electrodes without using black matrix.

Figure 12:
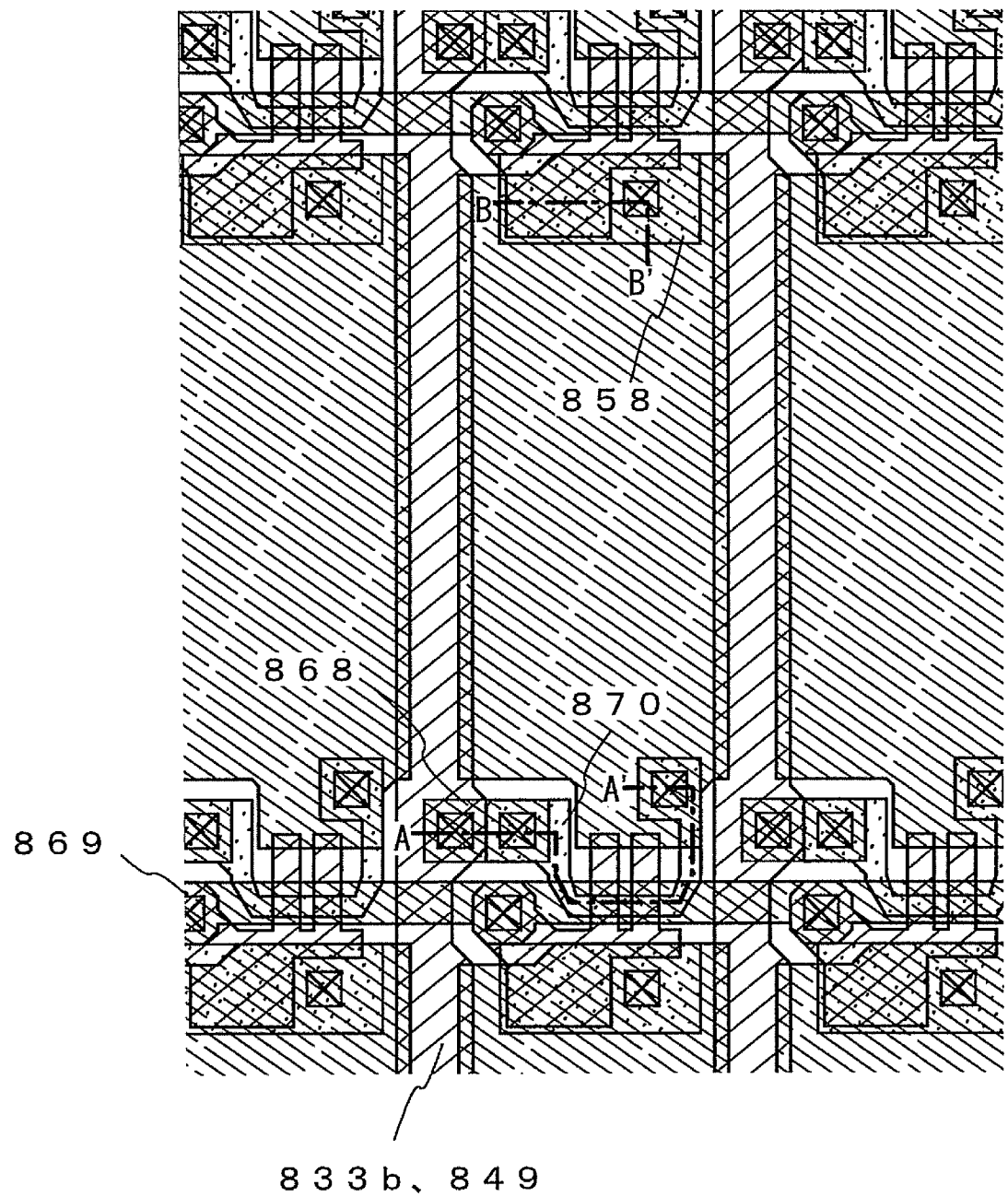
FIG. 12 is a top view of a pixel portion in an active matrix substrate in Embodiment 2 of the present invention.

Further, FIG. 12 shows a top view of the pixel portion of the active matrix substrate manufactured in this embodiment. The portions corresponding to FIGS. 8A to 11 are denoted by the same reference numerals. A dotted line A-A' in FIG. 11 corresponds to a cross-sectional view taken along a dotted line A-A' in FIG. 12. Further, a dotted line B-B' in FIG. 11 corresponds to a cross-sectional view taken along a dotted line B-B' in FIG. 12.

Embodiment 3

Figure 13:
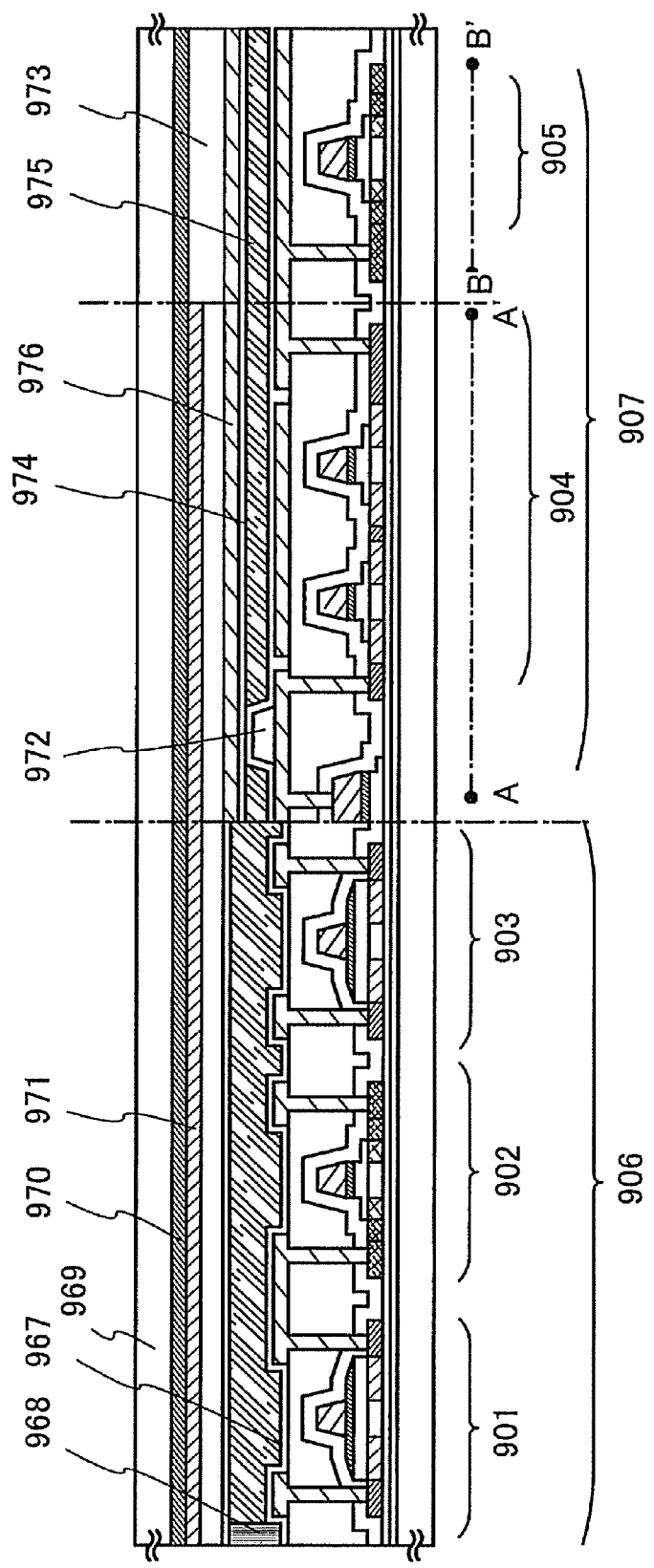
FIG. 13 is a cross-sectional view illustrating a manufacturing step of an active matrix liquid crystal display device in Embodiment 3 of the present invention.

This embodiment will describe below steps of manufacturing a reflective liquid crystal display device from the active matrix substrate manufactured in Embodiment 2. FIG. 13 is used for description.

First, after the active matrix substrate of FIG. 11 is obtained in accordance with Embodiment 2, an alignment film 967 is formed over the active matrix substrate of FIG. 11, at least over the pixel electrode 870, and rubbing treatment is performed. In this embodiment, before the alignment film 967 is formed, a columnar spacer 972 for keeping a substrate interval is formed in a desired position by patterning an organic resin film such as an acrylic resin film. Instead of a columnar spacer, a spherical spacer may be dispersed entirely on the substrate surface.

Next, a counter substrate 969 is prepared. Then, colored layers 970 and 971 and a planarization film 973 are formed on the counter substrate 969. The red colored layer 970 and the blue colored layer 971 overlap to form a light-shielding portion. Alternatively, the red colored layer and a green colored layer may partially overlap to form a light-shielding portion.

In this embodiment, a substrate shown in Embodiment 2 is used. Accordingly, in FIG. 12 showing a top view of the pixel portion of Embodiment 2, it is necessary to shield at least spaces between the gate wiring 869 and the pixel electrode 870, the gate wiring 869 and the connection electrode 868, and the connection electrode 868 and the pixel electrode 870 from light. In this embodiment, each colored layer is arranged so that light-shield portions of the stacked colored layers overlap with the positions where light is to be blocked, and the counter substrate is attached.

In such a manner, spaces between the pixels are shielded with the light-shielded portions of the stacked colored layers without forming a light-shield layer such as a black mask, whereby the number of steps can be reduced.

Next, a counter electrode 976 formed using a transparent conductive film on the planarization film 973 is formed at least in the pixel portion, an alignment film 974 is formed on the entire surface of the counter substrate, and rubbing treatment is performed.

Then, the active matrix substrate provided with the pixel portion and the driver circuit is attached to the counter substrate with a sealant 968. The sealant 968 contains filler. The two substrates can be attached to have a uniform interval therebetween due to this filler and the columnar spacer. After that, a liquid crystal material 975 is injected between both substrates, and the substrates are completely sealed with a sealing material (not shown). The liquid crystal material 975 may be a known liquid crystal material. In such a manner, a reflective liquid crystal display device shown in FIG. 13 is completed. If needed, the active matrix substrate or the counter substrate is cut into the desired shape. Furthermore, a polarizing plate (not shown) is attached to only the counter substrate. Then, an FPC is attached using a known technique.

A liquid crystal display panel manufactured as described above can be used for a display portion of various kinds of electronic devices.

Embodiment 4

This embodiment will describe an example in which a light-emitting device is manufactured by the present invention. In this specification, the light-emitting device is a generic term for a display panel where a light-emitting element formed over a substrate is sealed between the substrate and a cover material, and for a display module having the display panel equipped with an IC. Note that the light-emitting element has a layer containing an organic compound generating electroluminescence by applying an electric field (light-emitting layer), an anode layer, and a cathode layer. The luminescence in the organic compound includes one or both of the light emission (fluorescence) when exciton returns to the ground state from the singlet-excited state, and the light emission (phosphorescence) when exciton returns to the ground state from the triplet-excited state.

Figure 14:
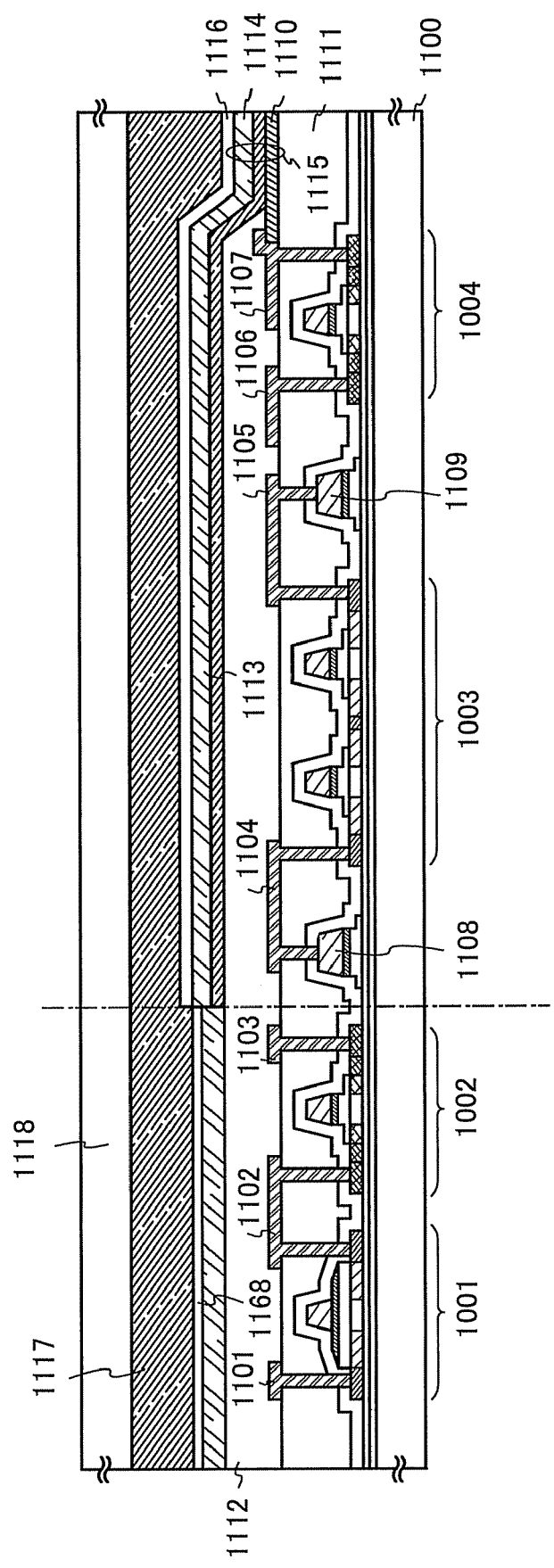
FIG. 14 is a cross-sectional structural view of a driver circuit and a pixel portion of a light-emitting device in Embodiment 4 of the present invention.

FIG. 14 is a cross-sectional view of the light-emitting device of this embodiment. A switching TFT 1003 provided over a substrate 1100 in FIG. 14 is formed using the n-channel TFT 903 in FIG. 11. Accordingly, a structure of the switching TFT 1003 is the same as that of the n-channel TFT 903 in FIG. 11.

Although a double gate structure in which two channel formation regions are formed is employed in this embodiment, a single gate structure in which one channel formation region is formed or a triple gate structure in which three channel formation regions are formed may be employed.

A driver circuit provided over the substrate 1100 is formed using the CMOS circuit of FIG. 11. Accordingly, a structure of the driver circuit is the same as those of the n-channel TFT 901 and the p-channel TFT 902 in FIG. 11. Note that the driver circuit has a single gate structure in this embodiment, but the driver circuit may have a double gate structure or a triple gate structure.

Wirings 1101 and 1103 each serve as a source wiring of the CMOS circuit, and a wiring 1102 serves as a drain wiring. A wiring 1104 serves as a wiring that electrically connects a source wiring 1108 and a source region of the switching TFT. A wiring 1105 serves as a wiring that electrically connects a drain wiring 1109 and a drain region of the switching TFT.

A current control TFT 1004 is formed using the p-channel TFT 902 of FIG. 11. Accordingly, a structure of the current control TFT 1004 is the same as that of the p-channel TFT 902 in FIG. 11. The current control TFT has a single gate structure in this embodiment, but the current control TFT may have a double gate structure or a triple gate structure.

A wiring 1106 is a source wiring (corresponding to a current supply line) of the current control TFT 1004. A wiring 1107 is an electrode that is electrically connected to a pixel electrode 1110 when the wiring 1107 overlaps with the pixel electrode 1110.

Note that the pixel electrode 1110 functions as an anode of the light-emitting element formed of a transparent conductive film. The transparent conductive film can be formed using a compound of indium oxide and tin oxide, a compound of indium oxide and zinc oxide, zinc oxide, tin oxide, or indium oxide. Moreover, the transparent conductive film doped with gallium may also be used. The pixel electrode 1110 is formed over a flat interlayer insulating film 1111 before forming those wirings. In this embodiment, it is very important to planarize the steps due to the TFTs using the interlayer insulating film 1111 including resin. The light-emitting layer formed later is so thin that the emission defect might occur due to the steps. Therefore, it is preferable to planarize the surface before forming the pixel electrode so that the light-emitting layer is formed on the plane as flat as possible.

After formation of the wirings 1101 to 1107, a partition 1112 is formed as shown in FIG. 14. The partition 1112 may be formed by patterning an insulating film containing silicon or an organic resin film each having a thickness of 100 to 400 nm.

Note that attention is needed to be paid for the element when the partition 1112 is formed so that the element may not be damaged due to static electricity because the partition 1112 is an insulating film. In this embodiment, the resistivity is lowered by adding a carbon particle or a metal particle in the insulating film, which is a material for the partition 1112, so as to prevent the static electricity. In such a case, the amount of the carbon particles or the metal particles is adjusted so that the resistivity ranges from $1 \times 10^6$ to $1 \times 10^{12}$ Ωm (preferably from $1 \times 10^8$ to $1 \times 10^{10}$ Ωm).

A light-emitting layer 1113 is formed over the pixel electrode 1110. Although FIG. 14 shows only one pixel, each of light-emitting layers corresponding to each color of R (red), G (green) or B (blue) are made in this embodiment. In addition, in this embodiment, a low-molecular organic light-emitting material is formed by an evaporation method. Specifically, a stacked structure is employed in which a 20-nm-thick copper phthalocyanine (CuPc) film is formed as a hole-injecting layer, and a 70-nm-thick tris-8-quinolinolato aluminum complex ($Alq_3$) film is formed thereover as the light-emitting layer. Adding the fluorescent pigment such as quinacridone, perylene, DCM1, or the like to $Alq_3$ can control the emission color.

However, the above is an example of the organic light-emitting material available as the light-emitting layer, and the material is not limited at all to those described above. The light-emitting layer, a charge-transporting layer, and a charge-injecting layer may be freely combined to form the light-emitting layer (the layer for emitting light and for moving the carrier for the light emission). For instance, although this embodiment shows an example in which the low-molecular organic light-emitting material is employed for the light-emitting layer, a high-molecular organic light-emitting material may also be employed. In addition, an inorganic material such as silicon carbide can also be used as the charge-transporting layer and the charge-injecting layer. These organic light-emitting material and inorganic material may be known materials.

Next, a cathode 1114 formed of a conductive film is provided over the light-emitting layer 1113. In this embodiment, an alloy film of aluminum and lithium is used as the conductive film. A known MgAg film (an alloy film of magnesium and silver) may be used. A conductive film made from an element belonging to Group 1 or 2 of the periodic table or a conductive film to which the element is added may be used as a material of the cathode 1114.

When the steps are conducted up to formation of the cathode 1114, a light-emitting element 1115 is completed. Note that the light-emitting element 1115 mentioned here is a diode including the pixel electrode 1110 (anode), the light-emitting layer 1113, and the cathode 1114.

It is effective to provide a passivation film 1116 so as to completely cover the light-emitting element 1115. The passivation film 1116 is formed using an insulating film including a carbon film, a silicon nitride film, or a silicon nitride oxide film in a single-layer structure or in a stacked structure.

Here, a film with good coverage is preferably used for the passivation film, and it is effective to employ a carbon film, especially a DLC (diamond-like carbon) film. Since the DLC film can be formed at temperatures ranging from the room temperature to 100° C. or less, the DLC film can be easily formed over the light-emitting layer 1113 having low heat resistance. Moreover, the DLC film has a high blocking effect against oxygen, and therefore, it is possible to suppress oxidization of the light-emitting layer 1113. Therefore, using the DCL film can prevent the light-emitting layer 1113 from being oxidized during the following sealing step.

Moreover, a sealing material 1117 is provided over the passivation film 1116 to paste a cover material 1118. A UV curable resin may be used as the sealing material 1117 and it is effective to provide a moisture absorption material or an antioxidant material inside. In addition, in this embodiment, the cover material 1118 is a glass substrate, a quartz substrate, or a plastic substrate (including a plastic film), each having carbon films (preferably DLC films) formed on opposite sides of the substrate.

Thus, the light-emitting device having the structure shown in FIG. 14 is completed. It is effective to perform continuously all the steps after forming the partition 1112 up to forming the passivation film 1116 in a film-forming apparatus of a multi-chamber type (or an in-line type) without being exposed to the air. Furthermore, it is possible to conduct the steps up to pasting the cover material 1118 continuously without being exposed to the air.

Thus, an n-channel TFT 1001, a p-channel TFT 1002, the switching TFT (n-channel TFT) 1003, and the current control TFT (n-channel TFT) 1004 are formed over the substrate 1100. The number of masks needed in these manufacturing steps up to here is less than that needed in manufacturing steps of a general active matrix light-emitting device.

That is to say, the step of manufacturing a TFT is simplified to a large degree, thereby improving the yield and reducing the production cost.

In addition, as described with FIG. 14, the provision of the impurity region overlapping the gate electrode with the insulating film interposed therebetween can form the n-channel TFT that has enough resistance against deterioration due to a hot-carrier effect. Therefore, a light-emitting device with high reliability can be obtained.

Although this embodiment shows only the structures of the pixel portion and the driver circuit, another logical circuit such as a signal division circuit, a D/A converter, an operational amplifier, a γ correction circuit, and the like can be further formed on the same insulator according to the manufacturing steps in this embodiment. Moreover, a memory and a microprocessor can be further formed.

Further, a light-emitting device of this embodiment in which the step up to sealing (or filling and sealing) for protecting the light-emitting element has been completed will be described with reference to FIGS. 15A and 15B. Note that the reference numerals used in FIG. 14 are referred as needed.

FIG. 15A is a top view showing a state in which the step up to sealing of the light-emitting element has been performed. FIG. 15B is a cross-sectional view taken along a line A-A' in FIG. 15A. In FIG. 15A, a reference numeral 1201 indicated by a dotted line denotes a source driver circuit; 1206, a pixel portion; 1207, a gate driver circuit; 1301, a cover material; 1302, a first sealant; 1303, a second sealant; and 1307, a sealing material provided in the space surrounded by the first sealant 1302.

Note that a reference numeral 1304 denotes a wiring that transmits a signal inputted to the source driver circuit 1201 and the gate driver circuit 1207 and receives a video signal and a clock signal from an FPC 1305 (flexible printed circuit) that is to be an external input terminal. Although only the FPC is shown here, this FPC may be provided with a print wiring board (PWB). The light-emitting device in this specification includes not only the light-emitting device itself but also the light-emitting device equipped with the FPC or a PWB.

Next, a cross-sectional structure is described with reference to FIG. 15B. The pixel portion 1206 and the gate driver circuit 1207 are formed over the substrate 1100, and the pixel portion 1206 includes a plurality of pixels including the current control TFT 1004 and the pixel electrode 1110 that is electrically connected to the drain of the current control TFT 1004. The gate driver circuit 1207 includes the CMOS circuit (see FIG. 11) in which the n-channel TFT 1001 and the p-channel TFT 1002 are combined.

The pixel electrode 1110 serves as an anode of the light-emitting element. In addition, the partition 1112 is formed at both ends of the pixel electrode 1110. The light-emitting layer 1113 and the cathode 1114 of the light emitting element are formed over the pixel electrode 1110.

The cathode 1114 also serves as the wiring common to all the pixels and is electrically connected to the FPC 1305 through the connection wiring 1304. Further, all the elements included in the pixel portion 1206 and the gate driver circuit 1207 are covered with the cathode 1114 and the passivation film 1116.

Moreover, the cover material 1301 is pasted with the first sealant 1302. A spacer including a resin film may be provided in order to keep the space between the cover material 1301 and the light-emitting element. The inside of the first sealant 1302 is filled with the sealing material 1307. It is preferable to employ an epoxy resin as the first sealant 1302 and the sealing material 1307. In addition, it is desirable to employ a material which hardly transmits moisture and oxygen to the first sealant 1302. Further, a moisture absorption material or an antioxidant material may be included inside the sealing material 1307.

The sealing material 1307 provided so as to cover the light-emitting element also serves as an adhesive to paste the cover material 1301. In addition, FRP (Fiberglass-Reinforced Plastics), PVF (polyvinyl fluoride), polyester, or acrylic can be employed as the material for a plastic substrate constituting a part of the cover material 1301 in this embodiment.

After bonding the cover material 1301 with the use of the sealing material 1307, a second sealant 1303 is provided so as to cover the side surface (the exposed surface) of the sealing material 1307. The second sealant 1303 can be formed using the same material as that of the first sealant 1302.

The light-emitting element is filled and sealed with the sealant 1307 in such a structure as described, whereby the light-emitting element can be completely shield from the outside, and a substance promoting deterioration caused by oxidation of the light-emitting layer due to moisture, oxygen, and the like can be prevented from penetrating from the outside. Accordingly, a light-emitting device with high reliability can be obtained.

Embodiment 5

This embodiment will describe a semiconductor device of the present invention in which an active matrix display device including a TFT circuit is incorporated, with reference to drawings.

As such a semiconductor device, a portable information terminal (such as an electronic notebook, a mobile computer, and a cellular phone), a video camera, a still camera, a personal computer, a television, and the like can be given. Examples thereof are shown in FIGS. 16A to 18D.

Figure 16A:
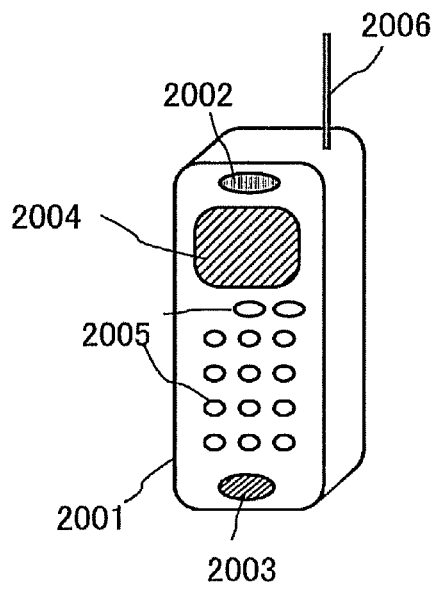
FIGS. 16A to 16E are diagrams each showing an example of a semiconductor device in Embodiment 5 of the present invention.

FIG. 16A is a cellular phone, which includes a main body 2001, an audio output portion 2002, an audio input portion 2003, a display device 2004, operation switches 2005, and an antenna 2006. The present invention can be applied to the audio output portion 2002, the audio input portion 2003, and the display device 2004 provided with an active matrix substrate.

Figure 16B:
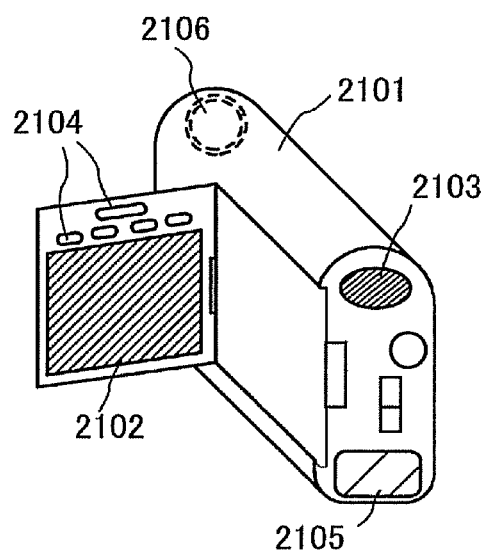

FIG. 16B is a video camera, which includes a main body 2101, a display device 2102, an audio input portion 2103, operation switches 2104, a battery 2105, and an image receiving portion 2106. The present invention can be applied to the audio input portion 2103, the display device 2102 provided with an active matrix substrate, and the image receiving portion 2106.

Figure 16C:
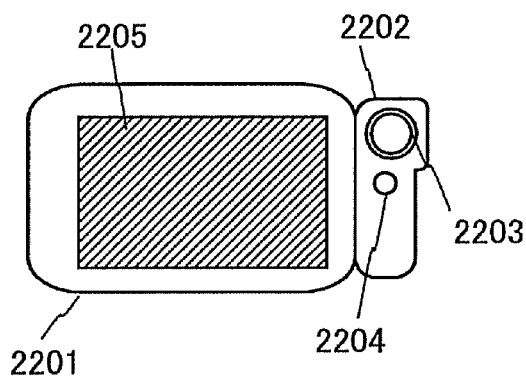

FIG. 16C is a mobile computer or a portable information terminal, which includes a main body 2201, a camera portion 2202, an image receiving portion 2203, an operation switch 2204, and a display device 2205. The present invention can be applied to the image receiving portion 2203 and the display device 2205 provided with an active matrix substrate.

Figure 16D:
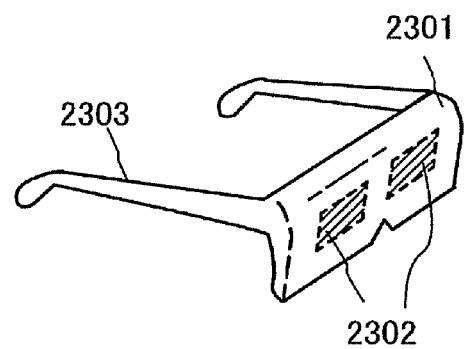

FIG. 16D is a goggle display, which includes a main body 2301, a display device 2302, and an arm portion 2303. The present invention can be applied to the display device 2302. Although not shown, the present invention can be used for another signal control circuit.

Figure 16E:
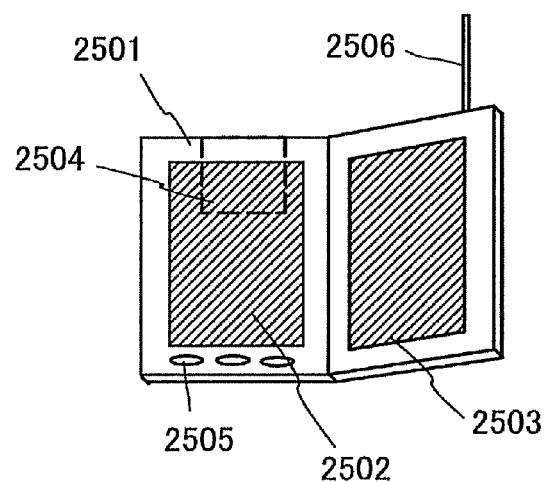

FIG. 16E is a portable book, which includes a main body 2501, display devices 2502 and 2503, a storage medium 2504, operation switches 2505, and an antenna 2506, and displays data stored in mini discs (MD) or DVDs (Digital Versatile Disc) and data received at the antenna. The display devices 2502 and 2503 are direct view-type display devices, and the present invention can be applied thereto.

Figure 17A:
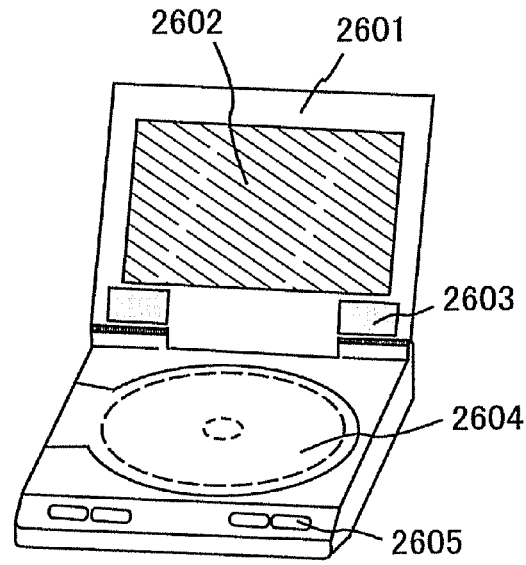
FIGS. 17A to 17C are diagrams each showing an example of a semiconductor device in Embodiment 5 of the present invention.

FIG. 17A is a record player using a recording medium that records programs (hereinafter, refer to as a recording medium), which includes a main body 2601, a display device 2602, a speaker portion 2603, a recording medium 264, and an operation switch 2605. Note that by using a DVD, a CD, or the like as the recording medium, this device can be used for listening music, watching movie, games, and the Internet. The present invention can be applied to the display device 2602.

Figure 17B:
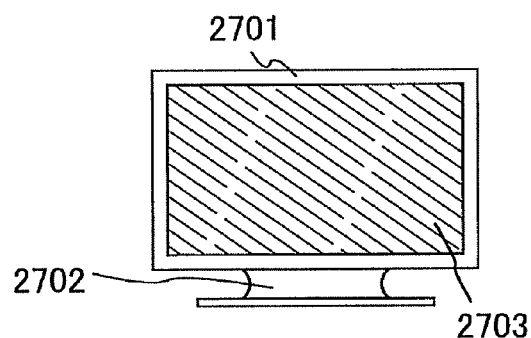

FIG. 17B is a television, which includes a main body 2701, a support base 2702, and a display portion 2703. The present invention can be applied to the display portion 2703.

Figure 17C:
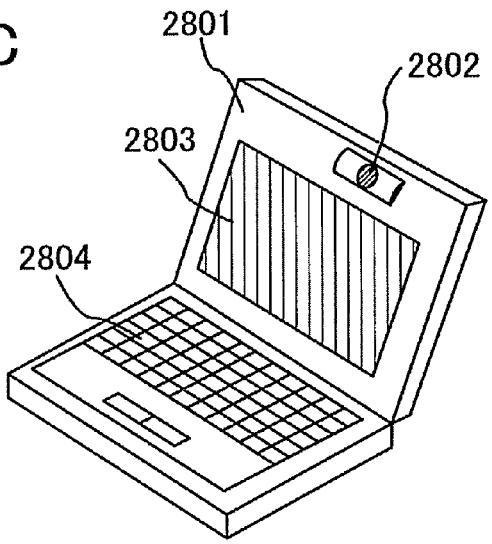

FIG. 17C is a personal computer, which includes a main body 2801, an image input portion 2802, a display device 2803, and a keyboard 2804. The present invention can be applied to the display device 2803.

Figure 18A:
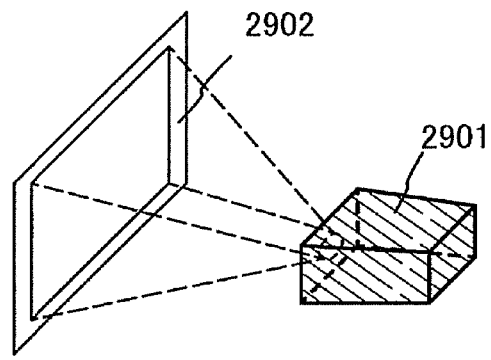
FIGS. 18A to 18D are diagrams each showing an example of a semiconductor device in Embodiment 5 of the present invention.

FIG. 18A is a front projector, which includes a projection device 2901 and a screen 2902. The present invention can be applied to the projection device and another signal control circuit.

Figure 18B:
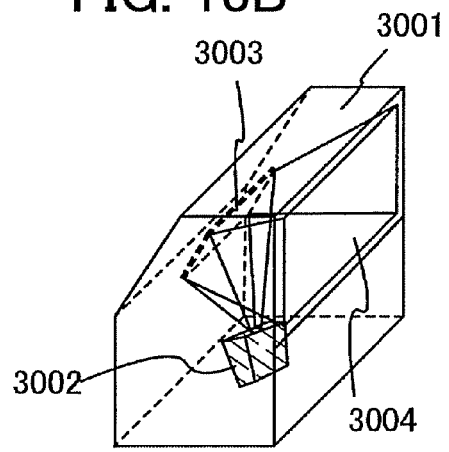

FIG. 18B is a rear projector, which includes a main body 3001, a projection device 3002, a mirror 3003, and a screen 3004. The present invention can be applied to the projection device and another signal control circuit.

Figure 18C:
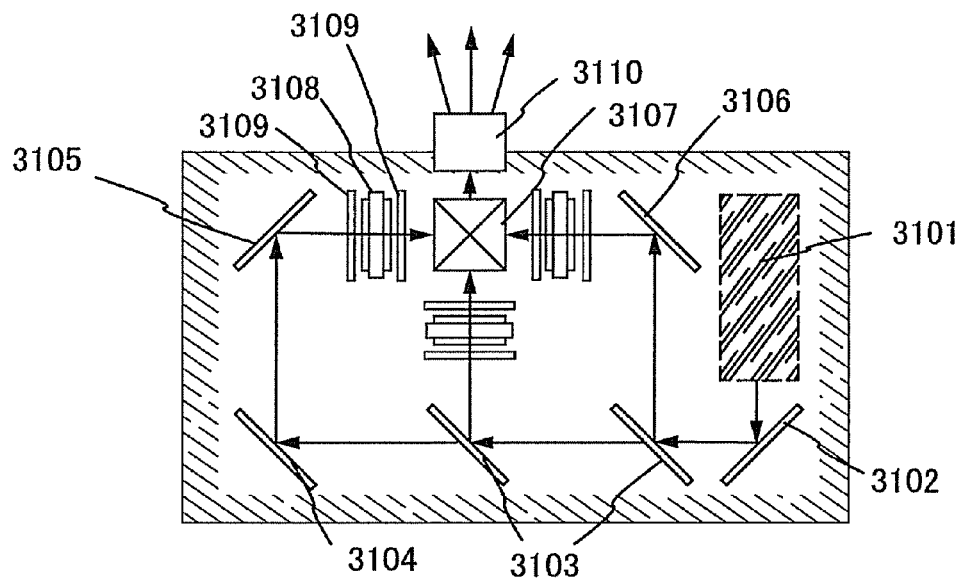

FIG. 18C is a diagram illustrating a structural example of the projection devices 2901 and 3002 in FIGS. 18A and 18B. The projection devices 2901 and 3002 each include a light-source optical system 3101, mirrors 3102 and 3104 to 3106, a dichroic mirror 3103, a prism 3107, a liquid crystal display device 3108, a retardation film 3109, and a projection optical system 3110. The projection optical system 3110 is constituted by an optical system including a projection lens. Although an example of a three-plate mode is shown in this embodiment, the mode is not particularly limited to this, and for example, a single-plate mode may be employed. A practitioner may provide an optical system such as an optical lens, a film having polarizing function, a film for adjustment of a phase difference, or an IR film as appropriate in a light path indicated by arrows in FIG. 18C.

Figure 18D:
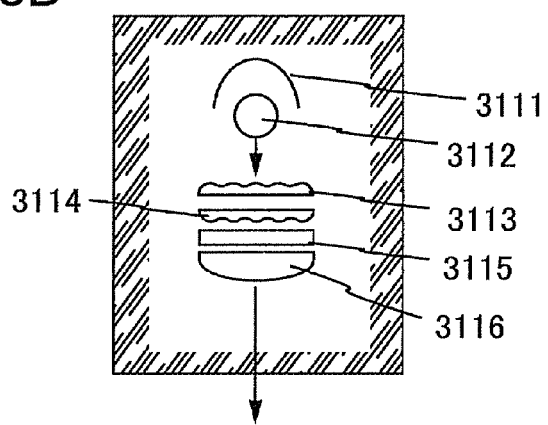

FIG. 18D is a diagram illustrating a structural example of the light-source optical system 3101 in FIG. 18C. In this embodiment, the light-source optical system 3101 includes a reflector 3111, a light source 3112, lens arrays 3113 and 3114, a polarization-conversion 3115, and a condensing lens 3116. Note that the light-source optical system shown in FIG. 18D is just an example, and it is not particularly limited to this. For example, a practitioner may provide an optical system such as an optical lens, a film having polarizing function, a film for adjustment of a phase difference, or an IR film as appropriate in the light-source optical system.

In addition, the present invention can be applied to a light-emitting display element. In such a manner, the present invention can be applied in quite a wide range and can be applied to electronic appliances of every field.

This application is based on Japanese Patent Application serial no. 2007-076908 filed with Japan Patent Office on Mar. 23, 2007, the entire contents of which are hereby incorporated by reference.

What is claimed is:

1. A method for manufacturing a crystalline semiconductor film comprising the steps of:
   forming an amorphous semiconductor film over a substrate;
   forming a cap film over the amorphous semiconductor film; and
   irradiating simultaneously and with a single femtosecond laser a region of the cap film and a region of the semiconductor film underneath the region of the cap film through the cap film,
   wherein crystallization of the amorphous semiconductor film and removal of the cap film occur concurrently during the irradiating with the single femtosecond laser.

2. A method for manufacturing a crystalline semiconductor film according to claim 1,
   wherein the cap film is a $SiN_xO_y$ ($0 \leq x \leq 4/3$, $0 \leq y \leq 2$, $0 \leq 3x+2y \leq 4$) film.

3. A method for manufacturing a crystalline semiconductor film according to claim 1, wherein a thickness of the cap film is greater than or equal to 200 nm and less than or equal to 1000 nm.

4. A method for manufacturing a crystalline semiconductor film according to claim 1,
wherein the crystalline semiconductor film is a polycrystalline semiconductor film.

5. A method for manufacturing a crystalline semiconductor film according to claim 1, further comprising the step of:
forming a base film over the substrate before forming the amorphous semiconductor film.

6. A method for manufacturing a crystalline semiconductor film comprising the steps of:
forming an amorphous semiconductor film over a substrate;
forming a cap film comprising nitride over the amorphous semiconductor film;
crystallizing the amorphous semiconductor film by irradiation with a first laser through the cap film; and
removing the cap film by irradiation with a second laser that is a femtosecond laser with a wavelength in the infrared region through the cap film,
wherein the irradiation with the second laser is performed during the irradiation with the first laser.

7. A method for manufacturing a crystalline semiconductor film according to claim 6,
wherein the cap film is a $SiN_xO_y$ ($0 \leq x \leq 4/3$, $0 \leq y \leq 2$, $0 \leq 3x+2y \leq 4$) film.

8. A method for manufacturing a crystalline semiconductor film according to claim 6,
wherein a thickness of the cap film is greater than or equal to 200 nm and less than or equal to 1000 nm.

9. A method for manufacturing a crystalline semiconductor film according to claim 6,
wherein the crystalline semiconductor film is a polycrystalline semiconductor film.

10. A method for manufacturing a crystalline semiconductor film according to claim 6, further comprising the step of:
forming a base film over the substrate before forming the amorphous semiconductor film.

11. A method for manufacturing a crystalline semiconductor film according to claim 6,
wherein the first laser has a continuous wave or is pulsed with a repetition rate of 10 MHz or more.

12. A method for manufacturing a thin film transistor comprising the steps of:
forming an amorphous semiconductor film over a substrate;
forming a cap film over the amorphous semiconductor film;
irradiating simultaneously and with a single femtosecond laser a region of the cap film and a region of the semiconductor film underneath the region of the cap film through the cap film, and
forming a channel region, a source, and a drain region using the crystallized semiconductor film,
wherein crystallization of the amorphous semiconductor film and removal of the cap film occur concurrently during the irradiating with the single femtosecond laser.

13. A method for manufacturing a thin film transistor according to claim 12,
wherein the cap film is a $SiN_xO_y$ ($0 \leq x \leq 4/3$, $0 \leq y \leq 2$, $0 \leq 3x+2y \leq 4$) film.

14. A method for manufacturing a thin film transistor according to claim 12,
wherein a thickness of the cap film is greater than or equal to 200 nm and less than or equal to 1000 nm.

15. A method for manufacturing a thin film transistor according to claim 12,
wherein the crystallized semiconductor film is a polycrystalline semiconductor film.

16. A method for manufacturing a thin film transistor according to claim 12, further comprising the step of:
forming a base film over the substrate before forming the amorphous semiconductor film.

17. A method for manufacturing a thin film transistor comprising the steps of:
forming an amorphous semiconductor film over a substrate;
forming a cap film comprising nitride over the amorphous semiconductor film;
crystallizing the amorphous semiconductor film by irradiation with a first laser from above the cap film;
removing the cap film by irradiation with a second laser that is a femtosecond laser with a wavelength in the infrared region from above the cap film; and
forming a channel region, a source, and a drain region using the crystallized semiconductor film,
wherein the irradiation with the second laser is performed during the irradiation with the first laser.

18. A method for manufacturing a thin film transistor according to claim 17,
wherein the cap film is a $SiN_xO_y$ ($0 \leq x \leq 4/3$, $0 \leq y \leq 2$, $0 \leq 3x+2y \leq 4$) film.

19. A method for manufacturing a thin film transistor according to claim 17,
wherein a thickness of the cap film is greater than or equal to 200 nm and less than or equal to 1000 nm.

20. A method for manufacturing a thin film transistor according to claim 17,
wherein the crystallized semiconductor film is a polycrystalline semiconductor film.

21. A method for manufacturing a thin film transistor according to claim 17, further comprising the step of:
forming a base film over the substrate before forming the amorphous semiconductor film.

22. A method for manufacturing a thin film transistor according to claim 17,
wherein the first laser has a continuous wave or is pulsed with a repetition rate of 10 MHz or more.

* * * * *